US011310923B2

(12) United States Patent
Kelly et al.

(10) Patent No.: US 11,310,923 B2
(45) Date of Patent: *Apr. 19, 2022

(54) ENCLOSURE FOR ELECTRICAL EQUIPMENT

(71) Applicant: ENCLOSURES UNLIMITED INC., Libertyville, IL (US)

(72) Inventors: Paul Kelly, Libertyville, IL (US); John E. Hanley, Nashotah, WI (US); Jeffrey S. Bopp, Mundelein, IL (US); John Taveirne, Third Lake, IL (US); Steve C. Wolfe, Mundelein, IL (US)

(73) Assignee: Enclosures Unlimited Inc., Libertyville, IL (US)

( * ) Notice: Subject to any disclaimer, the term of this patent is extended or adjusted under 35 U.S.C. 154(b) by 312 days.

This patent is subject to a terminal disclaimer.

(21) Appl. No.: 16/734,944

(22) Filed: Jan. 6, 2020

(65) Prior Publication Data
US 2021/0212219 A1    Jul. 8, 2021

(51) Int. Cl.
*H05K 5/00* (2006.01)
*H05K 5/06* (2006.01)

(52) U.S. Cl.
CPC .......... *H05K 5/0004* (2013.01); *H05K 5/069* (2013.01)

(58) Field of Classification Search
CPC .............................. H05K 5/0004; H05K 5/069
See application file for complete search history.

(56) References Cited

U.S. PATENT DOCUMENTS

| | | |
|---|---|---|
| 3,444,345 A | 5/1969 | Mackiewicz |
| 4,445,622 A | 5/1984 | Sideri |
| 5,194,691 A | 3/1993 | McIlwraith |
| 5,292,189 A | 3/1994 | Lau et al. |
| 5,536,079 A | 7/1996 | Kostic |
| 5,547,272 A | 8/1996 | Paterson et al. |
| 5,682,017 A | 10/1997 | Marrotte |
| 5,886,868 A | 3/1999 | White et al. |
| 5,914,460 A | 6/1999 | Mowery et al. |
| 5,971,511 A | 10/1999 | Diebel et al. |

(Continued)

OTHER PUBLICATIONS

United States Patent Office Action for U.S. Appl. No. 16/547,057 dated Jun. 26, 2020 (26 pages).

(Continued)

*Primary Examiner* — Matthew W Ing
(74) *Attorney, Agent, or Firm* — Michael Best & Friedrich LLP

(57) ABSTRACT

A protective enclosure for electrical components includes a body having front and end openings, the body further including front, rear, and two side panels. A door selectively closes the front opening. An end cap closes the end opening. A ledge surrounds the end opening, the ledge lying perpendicular to the front, rear, and side panels, and a plurality of apertures are provided along the ledge. A gasket provides a seal between the end cap and ledge. A plurality of fasteners embedded into the end cap engage with a plurality of clips assembled onto the ledge at the plurality of apertures so as to form a permanent, one-time-use closure that compresses the gasket and maintains compression thereof in response to nothing more than movement of the end cap toward the ledge in a single installation direction perpendicular to the ledge.

19 Claims, 17 Drawing Sheets

(56) References Cited

U.S. PATENT DOCUMENTS

| | | | |
|---|---|---|---|
| 6,000,464 | A | 12/1999 | Scafidi et al. |
| 6,110,086 | A | 8/2000 | Moran, Jr. |
| 6,374,912 | B1 | 4/2002 | LaGrotta et al. |
| 6,605,777 | B1 | 8/2003 | Anderson et al. |
| 6,657,861 | B2 | 12/2003 | Irmer |
| 6,877,827 | B2 | 4/2005 | Holighaus et al. |
| 6,879,483 | B2 | 4/2005 | Johnson et al. |
| 6,881,898 | B2 | 4/2005 | Baker et al. |
| 6,924,572 | B2 | 8/2005 | Schmidt et al. |
| 7,068,516 | B2 | 6/2006 | Chan et al. |
| 7,071,409 | B2 | 7/2006 | Richard et al. |
| 7,075,003 | B2 | 7/2006 | Johnson et al. |
| 7,263,869 | B2 | 9/2007 | Durney et al. |
| 7,276,659 | B2 | 10/2007 | Thrift et al. |
| 7,532,482 | B2* | 5/2009 | Miller .................. H04Q 1/06 361/752 |
| 8,022,319 | B2 | 9/2011 | Lament et al. |
| 8,148,648 | B2 | 4/2012 | Nelson et al. |
| 8,456,814 | B2 | 6/2013 | Gerovac et al. |
| 8,599,540 | B2 | 12/2013 | Fernandez |
| 8,702,184 | B2 | 4/2014 | Lakoduk et al. |
| 8,802,978 | B2 | 8/2014 | Adducci et al. |
| 8,891,228 | B2 | 11/2014 | Gerovac |
| 9,066,586 | B2* | 6/2015 | Skovira .................. H05K 7/18 |
| 9,196,430 | B2 | 11/2015 | Li et al. |
| 9,247,658 | B2 | 1/2016 | McWilliams, Jr. et al. |
| 9,272,821 | B2 | 3/2016 | Manahan et al. |
| 9,455,560 | B1 | 9/2016 | Jopek et al. |
| 9,553,435 | B2 | 1/2017 | Manahan et al. |
| 9,559,501 | B2 | 1/2017 | Lindholdm et al. |
| 9,603,269 | B2 | 3/2017 | Omari et al. |
| 9,678,292 | B2 | 6/2017 | Landry et al. |
| 9,745,794 | B2* | 8/2017 | Ellingson .............. E06B 7/2309 |
| 2001/0033379 | A1 | 10/2001 | Huhta |
| 2002/0153373 | A1 | 10/2002 | Traut et al. |
| 2003/0090182 | A1 | 5/2003 | Johnson |
| 2006/0037773 | A1 | 2/2006 | Castaldo et al. |
| 2006/0119239 | A1 | 6/2006 | Werwick |
| 2007/0175648 | A1* | 8/2007 | Francisquini ............ H02B 1/01 174/50 |
| 2009/0021925 | A1 | 1/2009 | Heimann et al. |
| 2009/0100894 | A1 | 4/2009 | Durney et al. |
| 2011/0147037 | A1 | 6/2011 | Tee et al. |
| 2012/0055924 | A1 | 3/2012 | Roth |
| 2012/0212883 | A1 | 8/2012 | Hargreaves et al. |
| 2013/0264146 | A1 | 10/2013 | Nason et al. |
| 2014/0001932 | A1 | 1/2014 | Westby et al. |
| 2014/0124259 | A1 | 5/2014 | Dean et al. |
| 2016/0049778 | A1 | 2/2016 | Moench |
| 2016/0086710 | A1 | 3/2016 | Zweifel et al. |
| 2016/0113126 | A1* | 4/2016 | Guo .................. A47B 47/0058 312/326 |
| 2016/0206492 | A1 | 7/2016 | di Girolamo |
| 2016/0238303 | A1 | 8/2016 | Olson et al. |
| 2016/0368655 | A1 | 12/2016 | Drechsler et al. |
| 2017/0261184 | A1 | 9/2017 | Oksengendler et al. |
| 2020/0068736 | A1* | 2/2020 | Kelly .................... H02B 1/01 |
| 2020/0205308 | A1* | 6/2020 | Friestad ............... H05K 5/0217 |

OTHER PUBLICATIONS

Sonderhoff Chemicals GMBH, "Fermapor K31 A-9230-2-VP / K31 B-4 Technical Data Sheet," <https://www.scandiloc.dk/datablade/pursealing/FermaporK31/> web page publicly available at least as early as Jul. 31, 2018.

Sonderhoff Chemicals GMBH, "Fermapor K31 Brochure," <https://www.sonderhoff.com/fileadmin/assets/images/infopool/Broschueren/sonderhoff_fermapork31_en.pdf> web page publicly available at least as early as Jul. 31, 2018.

Forest City Technologies Inc., "Rimlex 620 BNA Product Data Sheet," publicly available at least as early as Aug. 16, 2018.

Anochrome Group, "Rimlex 620B Technical Data Sheet," publicly available at least as early as Aug. 16, 2018.

Emhart Teknologies, "PoP Closed End Rivets 5056 Aluminum Body/Steel Mandrel—Domed Head—Finish: Plain/Protective Coating," publicly available at least as early as Aug. 16, 2018.

Rampf, "RAKU-PUR Foam Gaskets," publicly available prior to Aug. 22, 2018.

United States Patent Office Action for U.S. Appl. No. 16/547,057 dated May 18, 2020 (22 pages).

\* cited by examiner

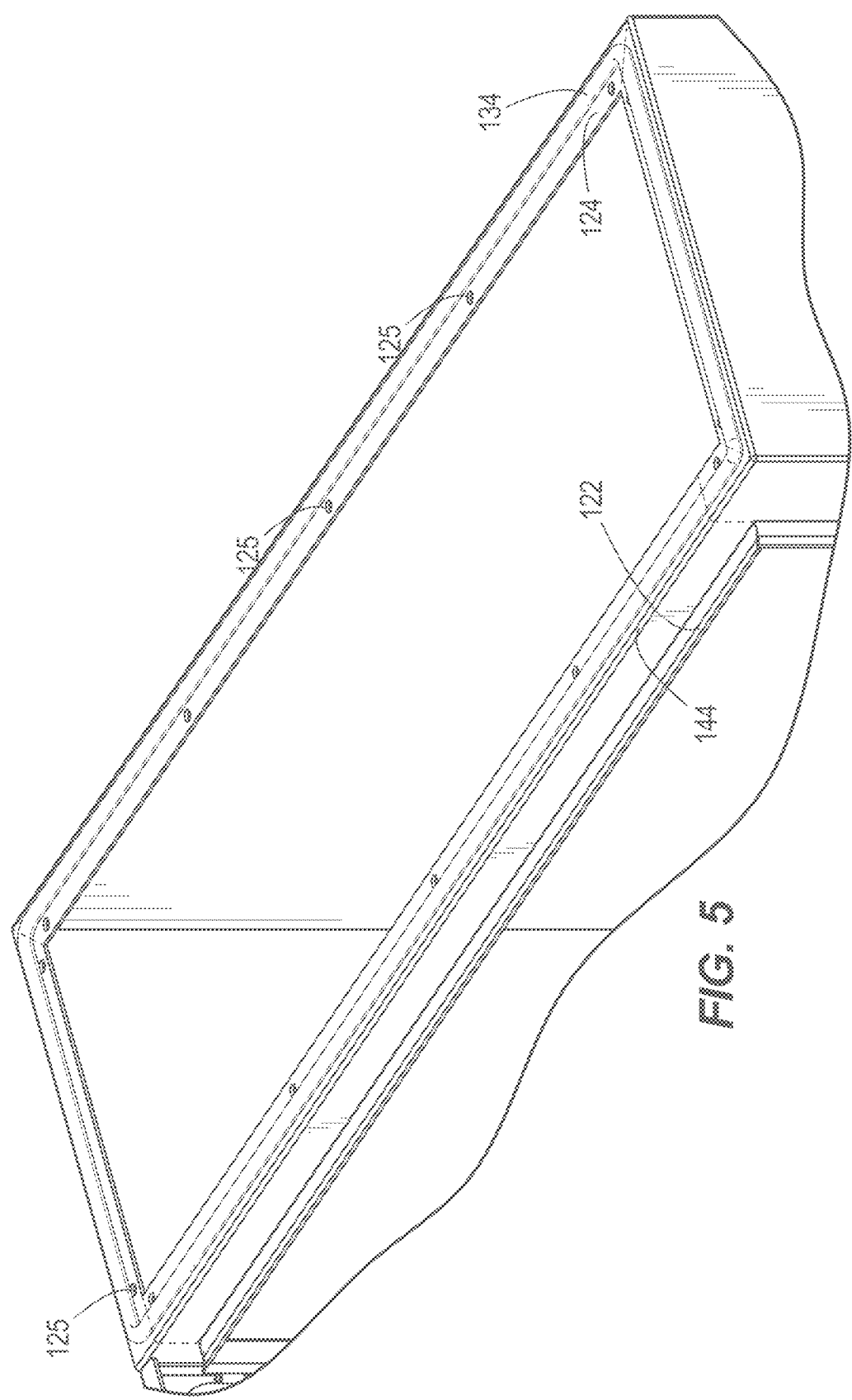

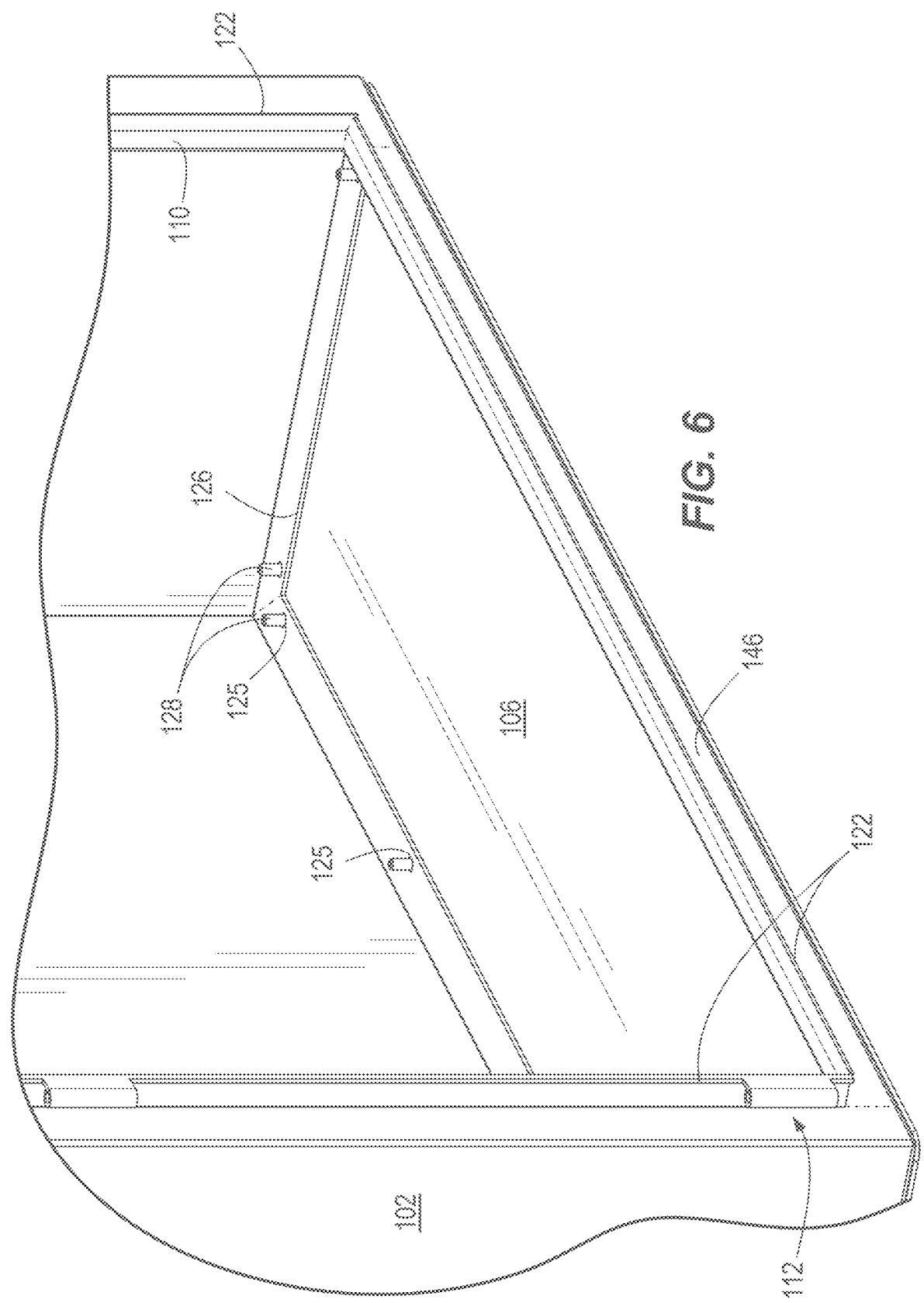

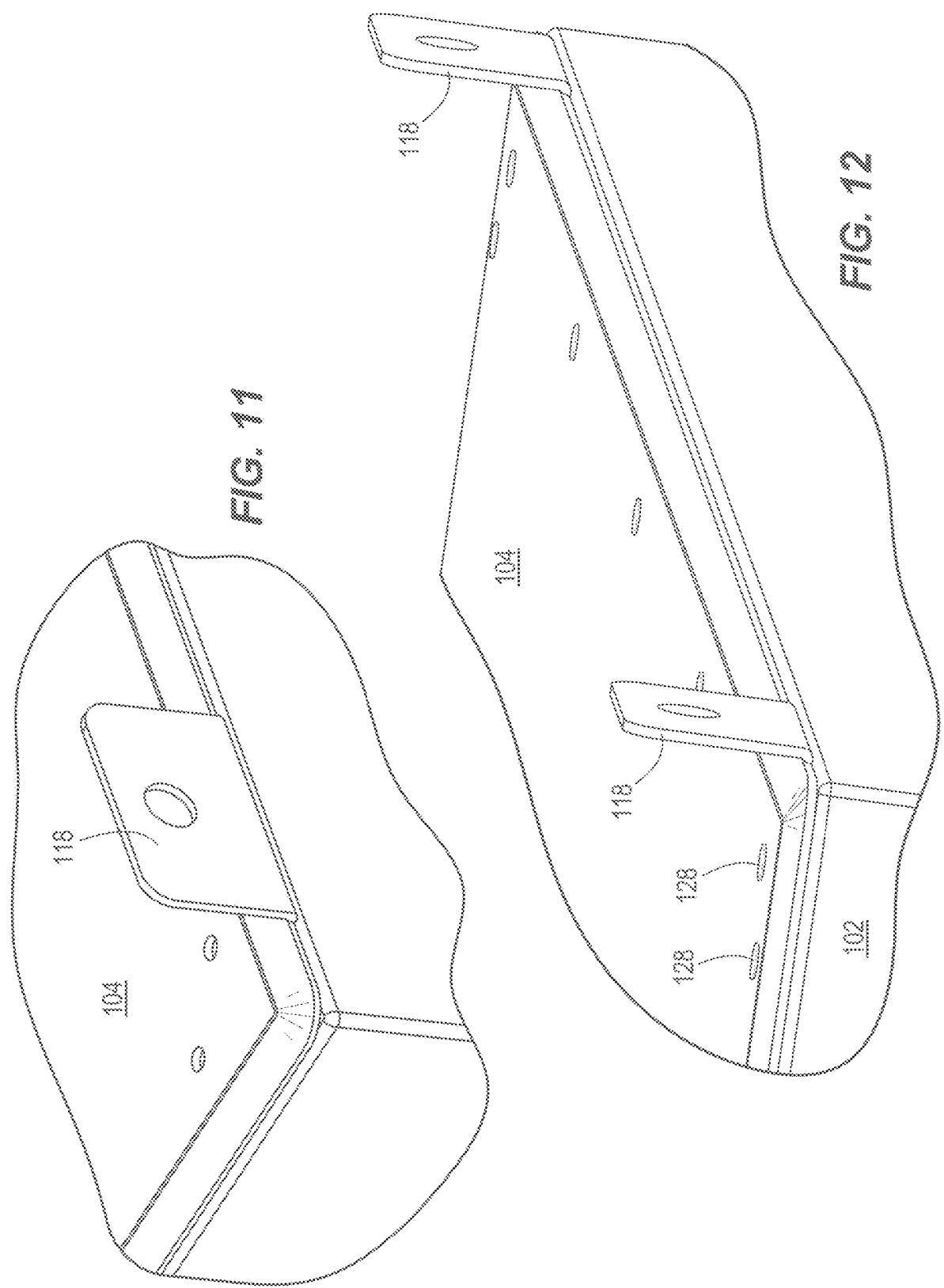

ENCLOSURE FOR ELECTRICAL EQUIPMENT

BACKGROUND

This disclosure relates to industrial enclosures suitable for housing electrical components, control systems, and the like.

SUMMARY

In one aspect, the invention provides a protective enclosure for electrical components. A body includes a front opening and an end opening, the body further including a front panel, a rear panel, and two side panels. A door is coupled to the body to selectively close the front opening. An end cap closes the end opening. A ledge is formed in the body to surround the end opening, the ledge lying perpendicular to the front, rear, and side panels. A plurality of apertures are provided along the ledge. A gasket provides a seal between the end cap and the ledge. A plurality of fasteners embedded into the end cap engage with a plurality of corresponding clips assembled onto the ledge at the locations of the plurality of apertures so as to form a permanent, one-time-use closure that compresses the gasket and maintains compression thereof in response to nothing more than movement of the end cap toward the ledge in a single installation direction perpendicular to the ledge.

In another aspect, the invention provides a protective enclosure for electrical components. A body defines a front opening, a first end opening with a first ledge, and a second end opening with a second ledge, wherein the body further includes a front panel, a rear panel, and two side panels, all of which are formed at least in part by a single continuous material sheet. A door is coupled to the body to selectively close the front opening. A first end cap is provided to close the first end opening. A first plurality of apertures is provided in the first ledge. A first gasket is disposed between the first end cap and the first ledge. A plurality of fasteners embedded into the first end cap engage with a plurality of corresponding clips assembled onto the first ledge at the locations of the first plurality of apertures so as to form a permanent, one-time-use closure that compresses the first gasket and maintains compression thereof in response to nothing more than movement of the first end cap toward the first ledge in a single installation direction perpendicular to the first ledge. A second end cap is provided to close the second end opening. A second plurality of apertures is provided in the second ledge. A second gasket is disposed between the second end cap and the second ledge. A plurality of fasteners embedded into the second end cap engage with a plurality of corresponding clips assembled onto the second ledge at the locations of the second plurality of apertures so as to form a permanent, one-time-use closure that compresses the second gasket and maintains compression thereof in response to nothing more than movement of the second end cap toward the second ledge in a single installation direction perpendicular to the second ledge. The first and second end openings are closed and sealed water-tight by the respective permanent, one-time-use closures of the first and second end caps.

In yet another aspect, the invention provides a method of assembling a protective enclosure for electrical components. A body is formed to define a front opening and an end opening, wherein the body further includes a front panel, a rear panel, and two side panels. A ledge is formed around the end opening, the ledge lying perpendicular to the front, rear, and side panels, the ledge having a plurality of apertures therein. A plurality of clips are attached to the ledge at the locations of the plurality of apertures. A door is coupled to the body to selectively close the front opening. An end cap is provided with a plurality of embedded fasteners protruding therefrom in an installation direction. A gasket is affixed to one of the end cap and the ledge. The end cap is pressed in the installation direction to move the plurality of fasteners toward and through the plurality of apertures in the ledge to form a permanent, water-tight, one-time-use closure that compresses the gasket and maintains compression thereof in response to nothing more than the pressing of the end cap in the installation direction.

BRIEF DESCRIPTION OF THE DRAWINGS

FIG. 5 is a perspective view of an upper portion of the enclosure with the upper end cap removed.

FIG. 6 is a perspective view of a lower portion of the enclosure with the door removed.

FIG. 11 is a detail perspective view of the top cap in position on a top flange of the enclosure body.

FIG. 12 is a detail perspective view of a rear edge portion of the upper end cap in position on the enclosure body.

DETAILED DESCRIPTION

Figure 1:
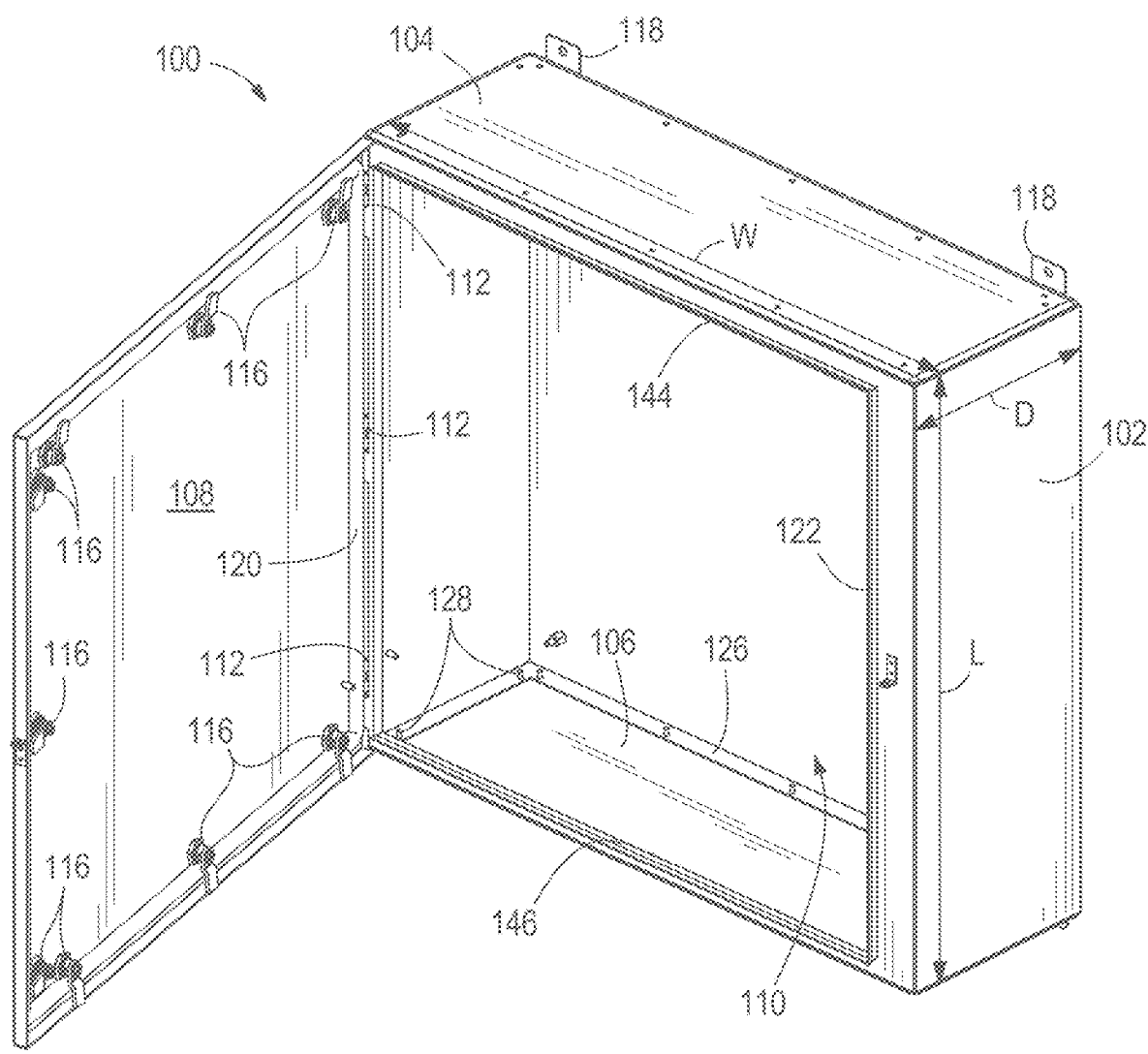
FIG. 1 is a perspective view of an enclosure according to a first embodiment of the present disclosure. A door of the enclosure is shown open.
Figure 2:
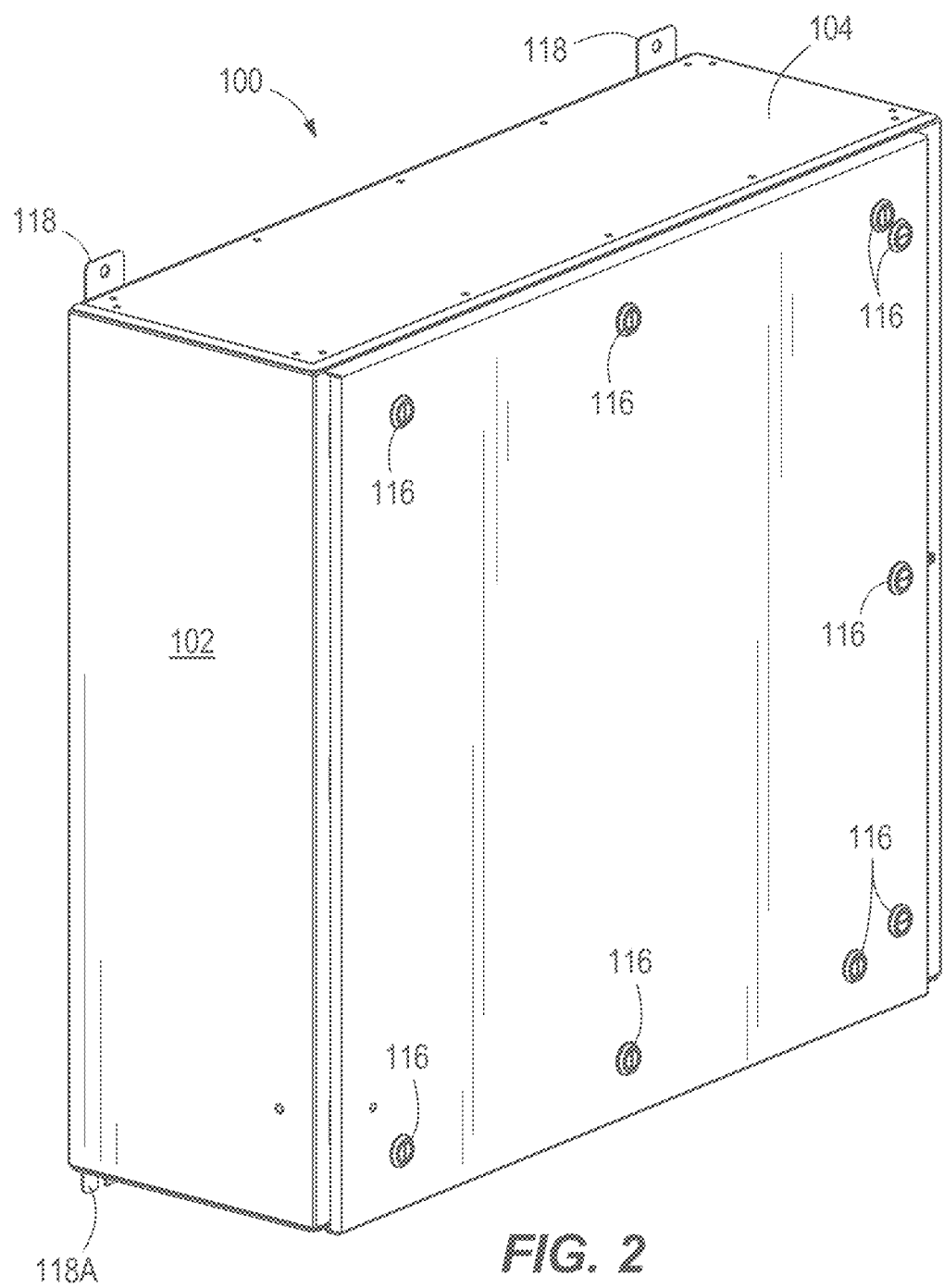
FIG. 2 is a perspective view of the enclosure of FIG. 1. The door of the enclosure is shown closed.
Figure 3:
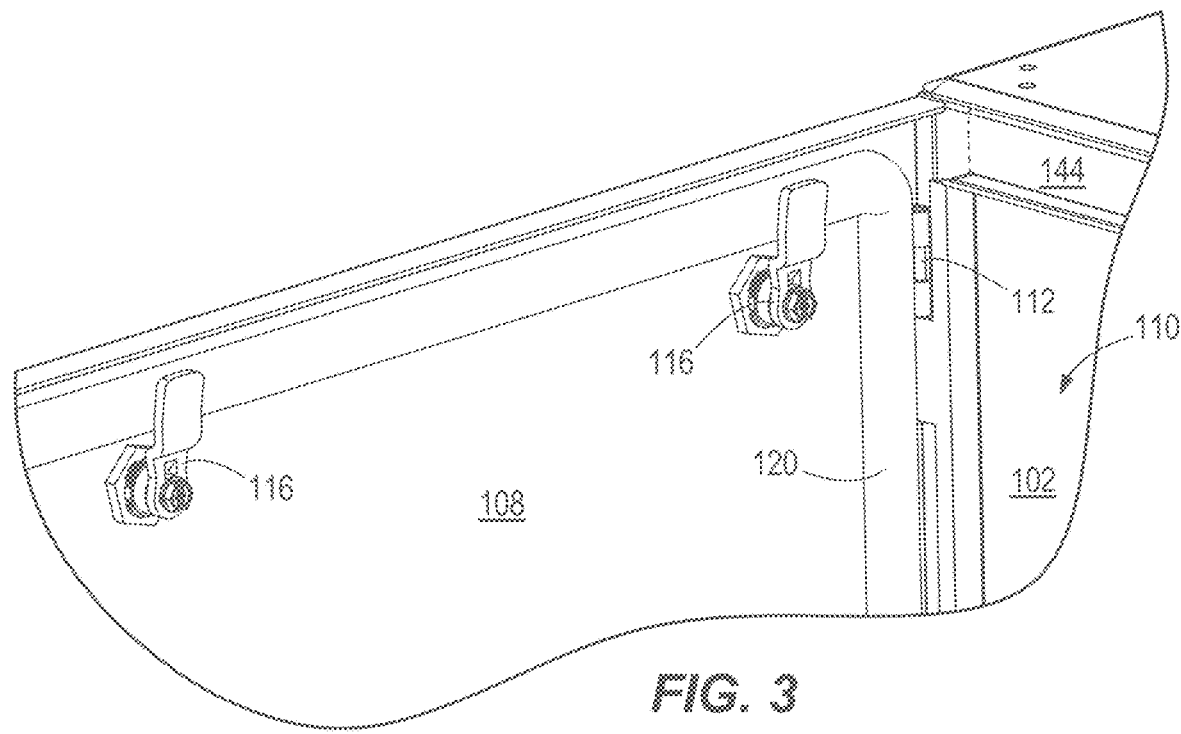
FIG. 3 is a detail view of a top edge of the enclosure as shown in FIG. 1.
Figure 4:
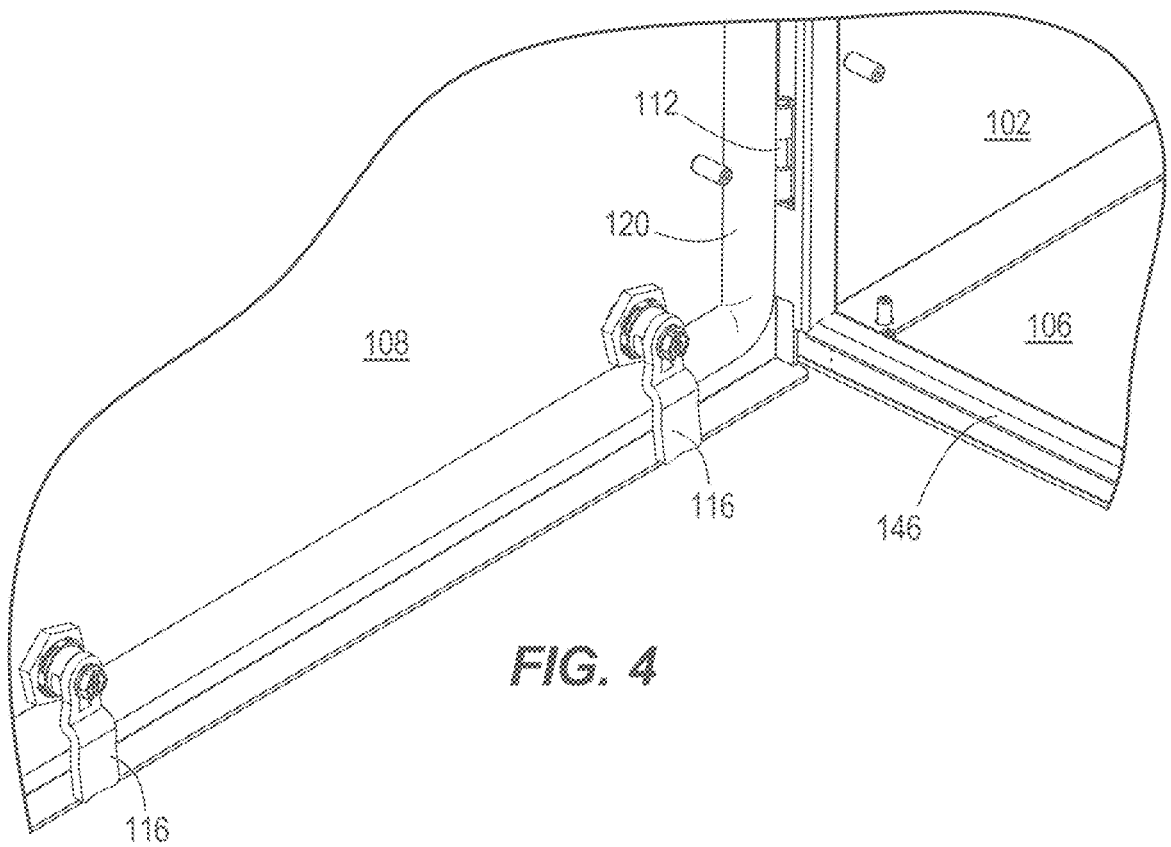
FIG. 4 is a detail view of a bottom edge of the enclosure as shown in FIG. 1.
Figure 8:
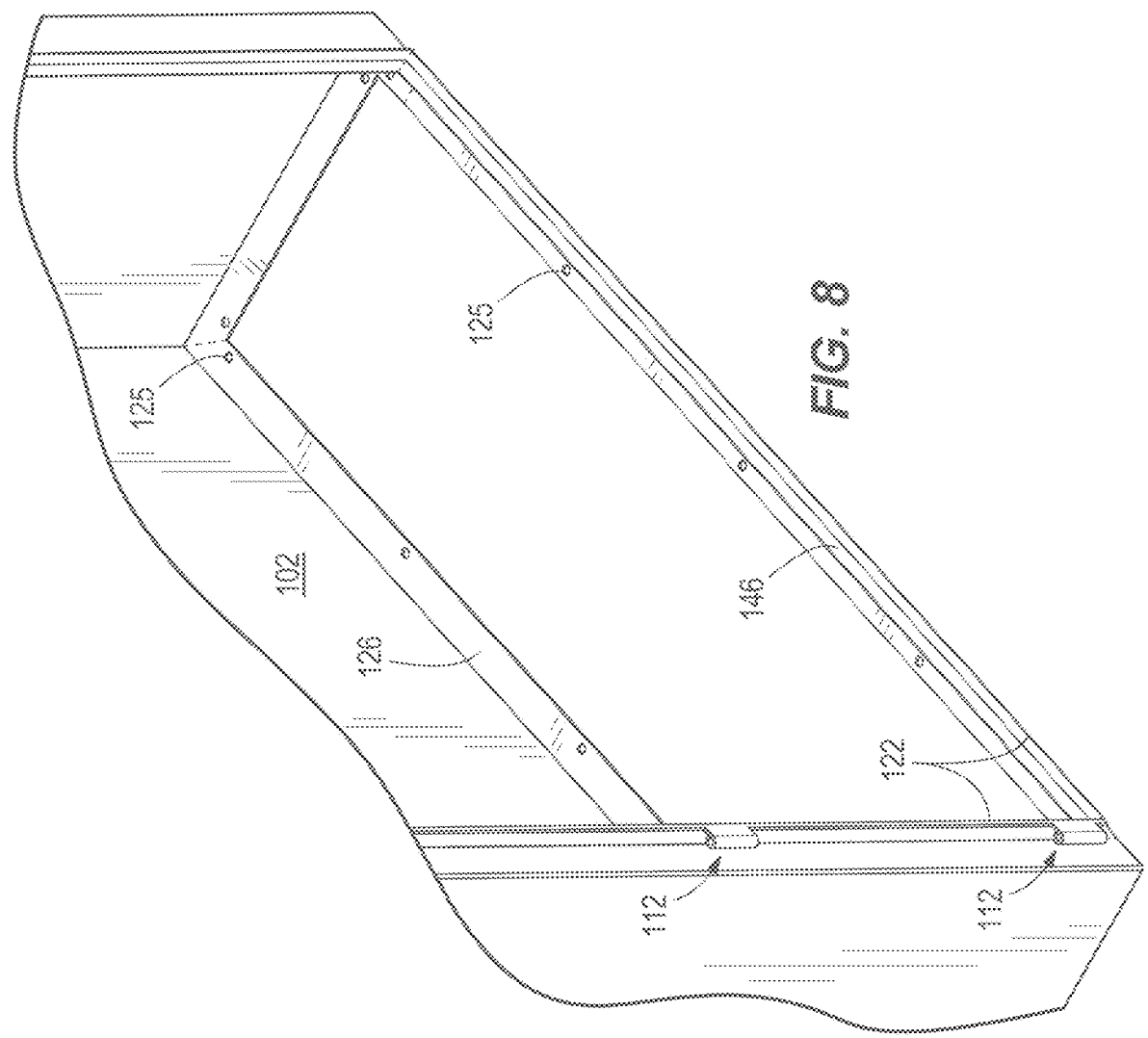
FIG. 8 is a perspective view of a lower portion of the enclosure with the door and lower end cap removed.
Figure 7:
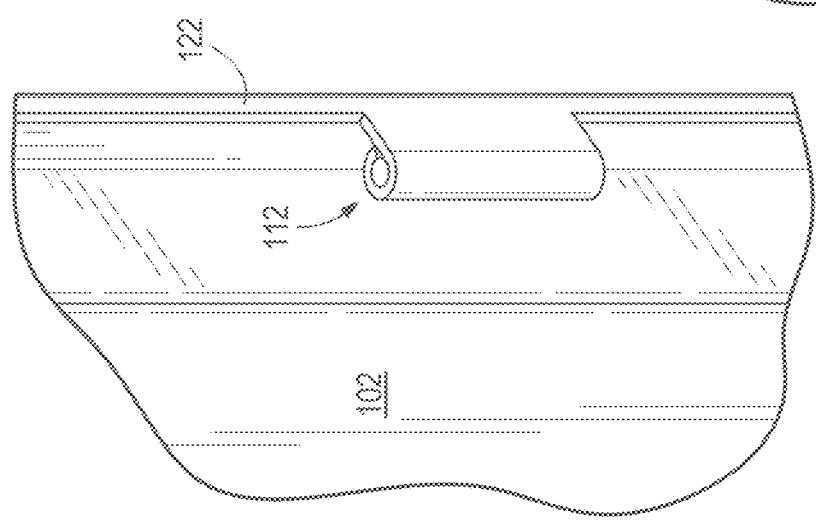
FIG. 7 is a detail view of a central one of the hinges on the enclosure body.

FIGS. 1 and 2 illustrate an enclosure 100 having a body 102, upper and lower end caps 104, 106, and a door 108 for selectively opening and closing an opening 110 formed in the body 102. The enclosure 100 is formed generally as a rectangular (or square) prism, defining a length L, a width W, and a depth D. The enclosure 100 is easily adapted to constructions having different L:W:D combinations, and it will be understood that the drawings illustrate only one such exemplary combination. The body 102 is formed to include a front panel, a back panel, and two side panels that span between the front and back panels, and the opening 110 is formed in the front panel, which spans the length and width dimensions L, W. As discussed further below, the panels of the body 102 are sheet-formed, and the enclosure 100 as a whole is void of any separate frame supporting the panels of the body 102. The door 108 is shown open in FIG. 1, in which configuration access is provided to an interior space of the enclosure 100. With the door 108 closed, as in FIG. 2, the interior space is sealed from the outside environment as discussed in further detail below. The door 108 is hingedly attached to the body 102 in the illustrated construction to allow the door 108 to pivot or swing with respect to the body 102. The attachment can include any number of hinges, or a continuous hinging along the length of the joint between the body 102 and the door 108. As shown, the enclosure 100 includes a first or upper hinge 112 (FIG. 3), a second or lower hinge 112 (FIG. 4), and a third or intermediate hinge 112 between the first and second hinges 112. Each hinge 112 can be formed in part by an integral shaped extension of the body 102 or the door 108, respectively, which interlace with each other and receive a hinge pin. FIGS. 6-8 illustrate the hinge formation feature in further detail, with respect to the body 102. The door 108 can be secured to or released from the body 102 by one or more latches or hasps 116, e.g., quarter-turn latches as shown. The illustrated latches 116 are provided along the top edge, the bottom edge, and the free edge of the door 108 spaced across from the hinges 112, e.g., each edge having multiple latches 116. However, the enclosure 100 can have a variety of alternate latch arrangements. Mounting brackets 118 can be provided at various locations along the enclosure 100 to facilitate attachment of the enclosure 100 to a fixed building structure or machine, for example. Each mounting bracket 118 can include an opening in the form of a hole, slot, etc., although other mounting structures are optional.

In some constructions, the enclosure 100 conforms to one or more industry standards for protecting its contents from intrusion of foreign matter such as water, dust, dirt, etc. Such standards may be set by the National Electrical Manufacturers Association (NEMA), International Electrotechnical Commission (IEC), or Underwriters Laboratories, Inc. (UL). Exemplary NEMA ratings include Type 1, Type 3, Type 3R, Type 4, Type 12, etc., and exemplary UL ratings include UL50E. Such ratings require testing of water-tightness, which simulate the ability for the enclosure to maintain a water-tight seal when exposed to windblown rain, splashing, hose spray, sleet, etc. Thus, for the purposes of this disclosure water-tight shall refer to being sealed from water intrusion to meet at least one such rating of NEMA, IEC, or UL. In order for the enclosure 100 to meet such a rating, the door 108 must seal to the body 102, and thus, a gasket 120 is provided (FIG. 1).

The gasket 120 is illustrated as being provided on the door 108 for selective contact with the body 102 when the door 108 is closed. However, the gasket 120 is provided on the body 102 in other constructions. Likewise, it is conceived to have gaskets on both the body 102 and the door 108. The gasket 120 is formed from any suitable sealing material and may be a compressible material softer than the material of the body 102 and the door 108 (e.g., sheet metal). One exemplary gasket material is a flexible polyurethane foam material. Such a foam material can be an addition-curing two-component system, for example a FERMAPOR® K31 product available from Sonderhoff Chemicals GmbH, Köln, Germany. In other constructions, the gasket 120 can be a RAKU-PUR® foam gasket product (e.g., RAKU-PUR 32-3250) available from RAMPF Giessharze GmbH, Grafenberg, Germany. The gasket 120 can be provided on the enclosure 100 using formed-in-place foam gasket (FIPFG) technology. In one construction, the gasket 120 is 0.500 in. wide and 0.250 in. high. As illustrated in FIG. 1, the gasket 120 is a peripheral gasket extending in a loop and conforming to the shape of the opening 110. At the opening 110, the body 102 includes a raised lip or ridge 122 that is aligned for contacting the gasket 120 when the door 108 is closed. Pressure on the gasket 120 can be maintained by the closed latches 116.

As best shown in FIGS. 5, 6, and 8, the body 102 includes a first or upper ledge 124 for receiving the upper end cap 104 at the top end of the body 102 and a second or lower ledge 126 for receiving the lower end cap 106 at the bottom end of the body 102. Each ledge 124, 126 is formed as a peripheral flange about the width and depth dimensions of the enclosure 100. The ledges 124, 126 lie in respective parallel planes at the ends of the enclosure 100, both planes being perpendicular to the front, rear, and side panels. The ledges 124, 126 can be provided with a plurality of dispersed apertures 125 as shown for connection of the upper and lower end caps 104, 106. For example, the upper and lower end caps 104, 106 can be attached to the respective ledges 124, 126 with individual fasteners 128 (FIG. 6), e.g., threaded fasteners or rivets, including closed-end self-sealing rivets. The rivets can be AD H series POP® rivets available from Emhart Teknologies, Shelton, Conn., for example AD 55 H. The rivets may have a polyurethane resin seal incorporated therewith (e.g., Rimlex® 620B available from Anochrome Group, Wolverhampton, UK). Furthermore, a top gasket 134 is provided between the upper end cap 104 and the upper ledge 124, and a bottom gasket 136 is provided between the lower end cap 106 and the lower ledge 126, for sealing of the caps to the body 102. The gaskets 134, 136 can be of a similar construction to the gasket 120 described above. The gaskets 134, 136 can be provided on the ledges 124, 126 (as shown in FIG. 5) or on the caps 104, 106, respectively. The placement of the gaskets 134, 136, each of which is formed as a continuous loop, is outboard of the fasteners 128 such that the fastener apertures are within the sealed space created by the gaskets 134, 136. There is no welding provided in the attachment of the upper and lower end caps 104, 106 to the body 102.

Figure 9:
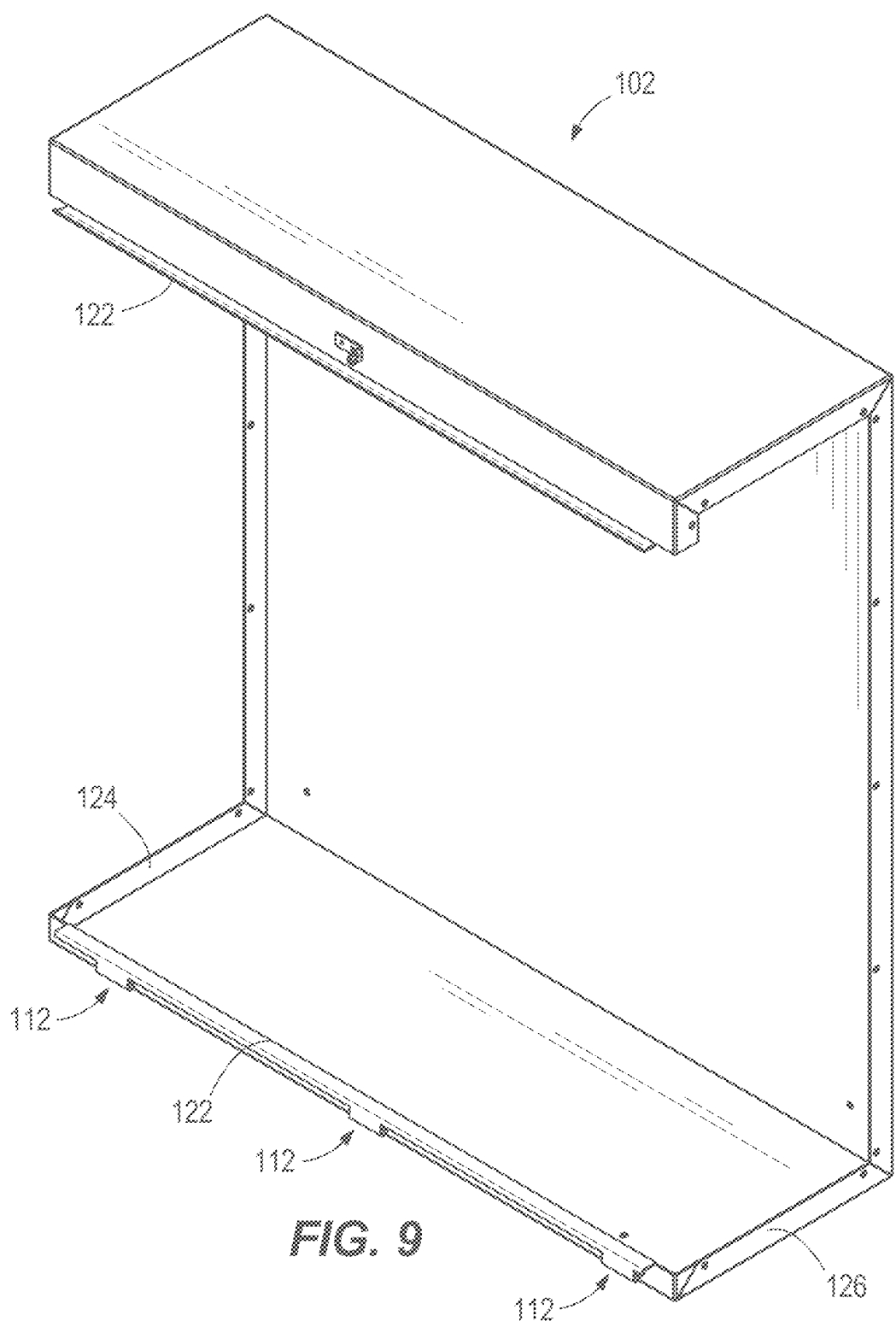
FIG. 9 is a perspective view of the enclosure body after initial forming and prior to attachment of upper and lower cross members.
Figure 10A:
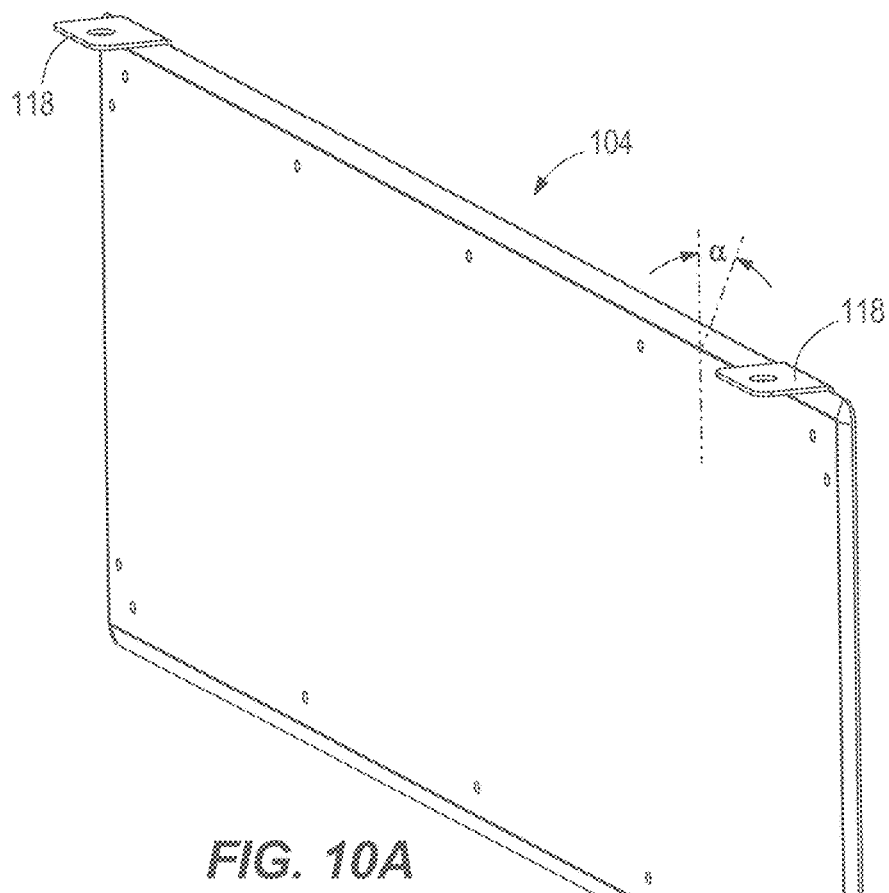
FIG. 10A is a first perspective view of the upper end cap.
Figure 10B:
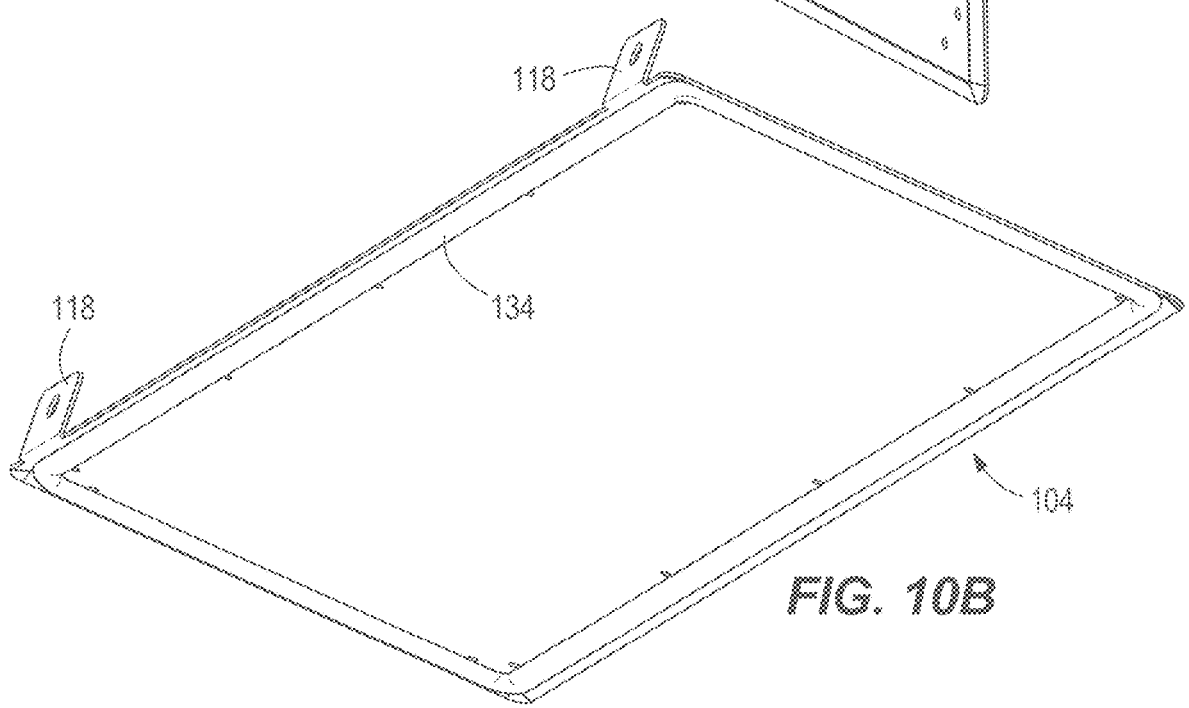
FIG. 10B is a second perspective view of the upper end cap.
Figure 14:
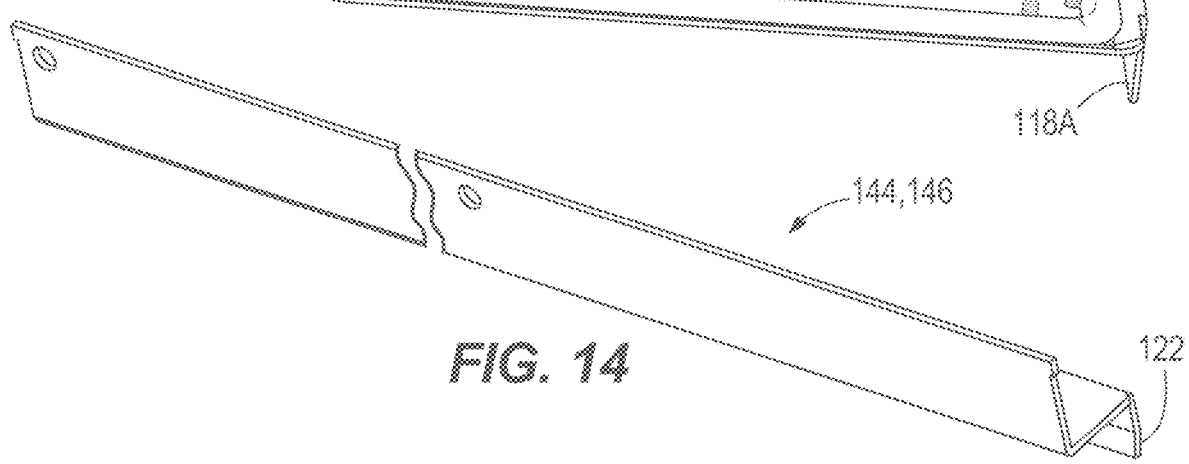
FIG. 14 is a perspective view of a cross member of the enclosure body.
Figure 15:
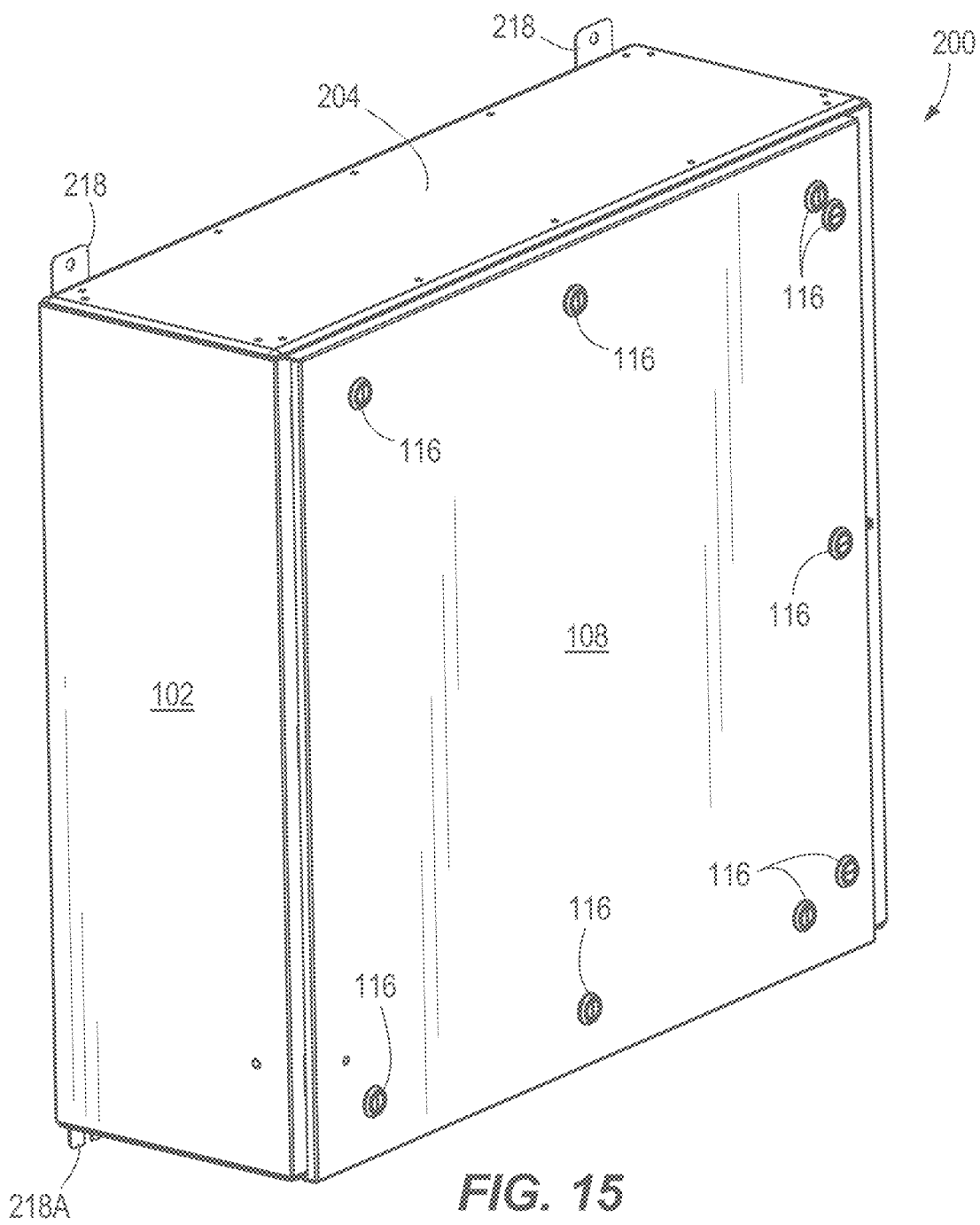
FIG. 15 is a first perspective view of an enclosure having an enclosure body with integral upper and lower mounting flanges.
Figure 16:
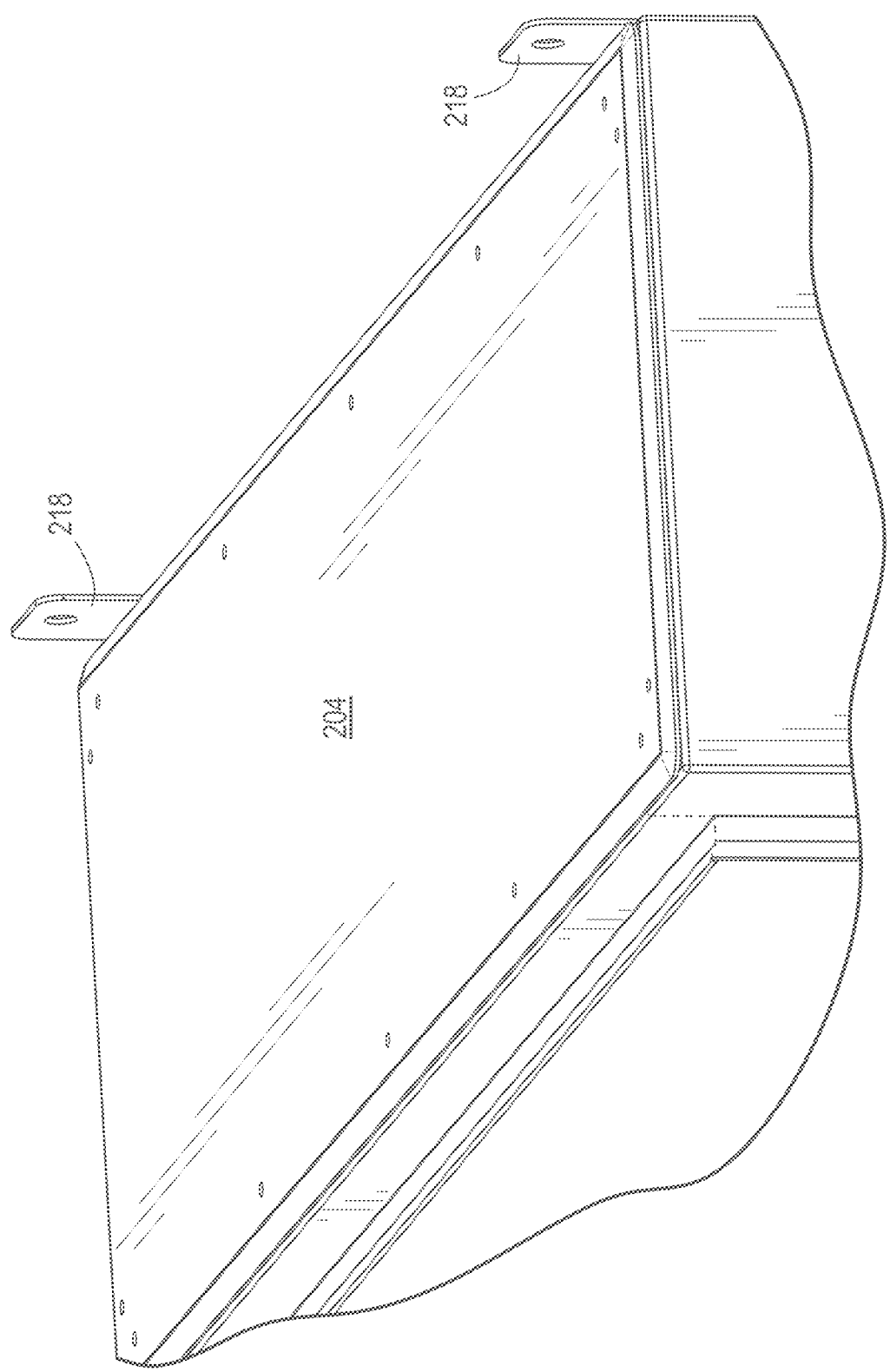
FIG. 16 is a second perspective view of the enclosure of FIG. 15.
Figure 17:
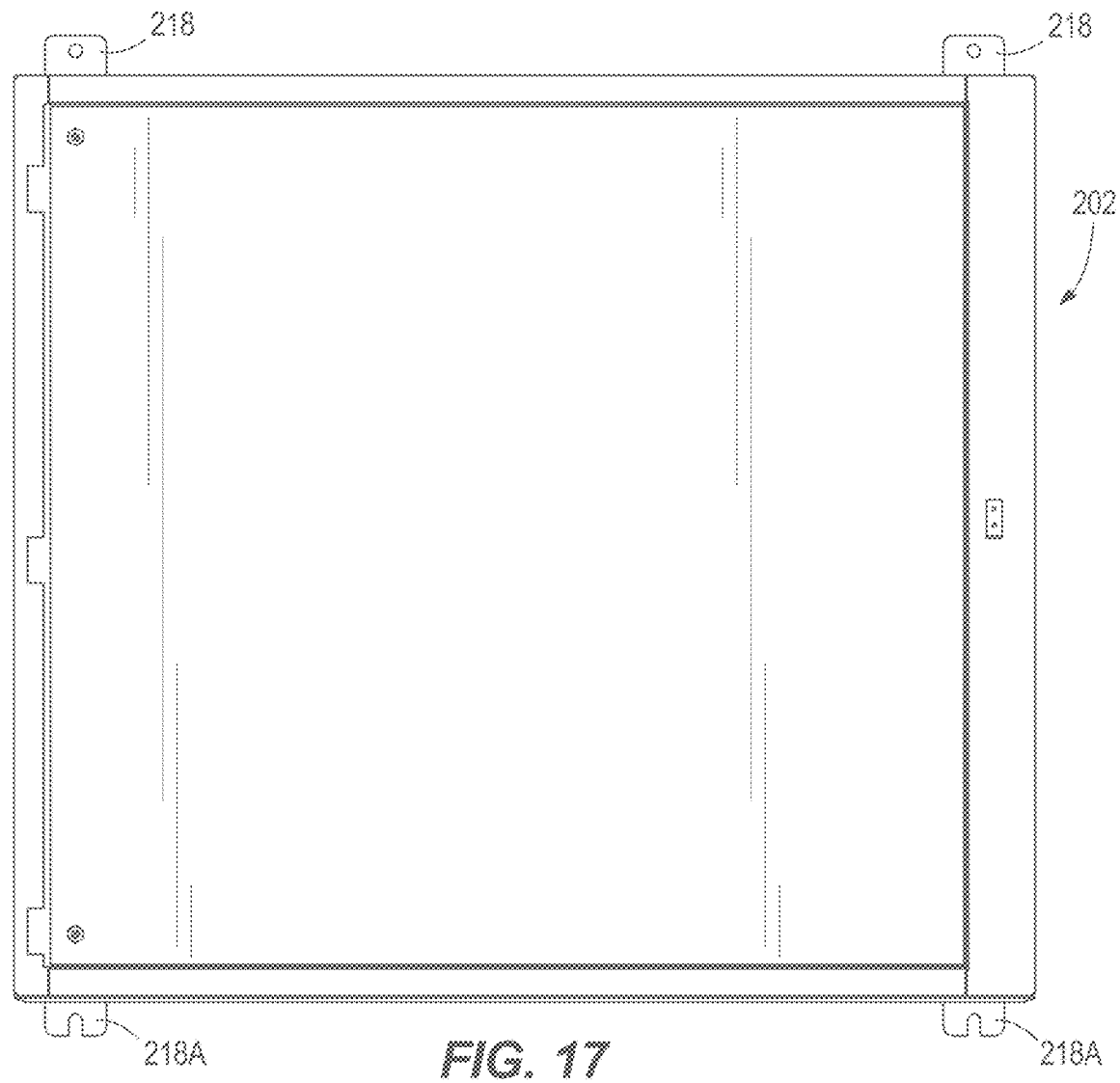
FIG. 17 is a front view of the enclosure of FIGS. 15 and 16, with a door and top cap removed.

The front, back and side panels of the body 102 can be integrally formed from a single material sheet, e.g., through stamping processes, as shown in FIG. 9. From a flat sheet of uniform material thickness, the body 102 can be stamped into a block letter C-shape formed by two separate, spaced sections or flanks of the front panel, the two side panels, and the back panel. Also integrally formed from the same sheet along with the front, back, and side panels are the lengthwise portions of the seal ridge 122 and the hinges 112. In addition, the upper and lower ledges 124, 126 are also integrally formed as bent extensions of the front, back, and side panels. In particular, the ledges 124, 126 are not separately formed and attached (e.g., by welding) to the front, back, and side panels of the body 102. However, the ledges 124, 126 themselves may be welded at corner miter joints to join various sections of folded-over material that combine to form each ledge 124, 126. It is also noted here that these corner welds at the upper and lower ledges 124, 126 may be the only welded joints on the body 102 in the form shown in FIG. 9, and thus, the body 102 is void of any lengthwise welds. In fact, the total length of the welds on the body 102 may be less than the perimeter length of one end of the enclosure 100 (i.e., 2W+2D). The enclosure 100 can be void of any single weld seam that spans the length L, void of any single weld seam that spans the width W, and void of any single weld seam that spans the depth D. Weld seams are indicated by dashed lines in FIGS. 3-6 and 8. Reducing the amount of welding in the construction of the enclosure 100 limits not only the time and labor necessary to produce the welds, but to subsequently dress the welds, e.g., by grinding, polishing, etc. In some constructions, the gaskets 120, 134, 136 can seal to meet the various NEMA, IEC, or UL standards, without any dressing of the welds. Rather, the manufacturing process may include application of the welds (e.g., by robotic welding, and optionally robotic laser welding), followed only by surface treatment (e.g., cleaning and/or coating, for example paint or powder coat) and assembly of the end caps 104, 106 and the door 108 to the body 102. Although the body 102 as shown in FIG. 9 includes no welds other than the corner welds at the upper and lower ledges 124, 126, additional welds may be used in connecting the separate portions of the as-stamped front panel with upper and lower cross members 144, 146. The total length of weld seams can be less than 100 cm (39.4 in), and even less than 90 cm (35.4 in) or less than 80 cm (31.5 in), for an enclosure having a volume of 20 liters (0.7 cu. ft.), 30 liters (1 cu. ft.), or more. Expanding one or more of the length L, width W, and depth D does not necessitate additional weld seam length since A) there are no lengthwise welds, B) the cross members 144, 146 can simply be extended as needed for a desired enclosure width, and C) the same four corner miter joints are needed at each end, regardless of the selected width and depth. The upper and lower cross members 144, 146 can have a similar or identical construction (see FIG. 14), and may be stamped sheet metal parts (e.g., of the same gauge as the body 102). The upper and lower cross members 144, 146 can each have multiple bends in the cross-section, thus forming the remaining portions of the seal ridge 122 surrounding the opening 110. The upper and lower cross members 144, 146 can further form the connecting segments of the upper and lower ledges 124, 126.

As shown in FIGS. 10A-12, the upper end cap 104 can be formed to include the mounting brackets 118 in some constructions. For example, the upper end cap 104 can be an integrally-stamped sheet, including the panel that closes the open end of the body 102 and the mounting brackets 118. In other constructions, the mounting brackets 118 can be formed separately from the end cap 104 and joined (e.g., by welding), to the end cap 104 and/or to the body 102. Returning to the construction of the upper end cap 104 as shown in FIGS. 10A-12, it can be seen that the shape is primarily flat throughout a majority central area of the cap 104. However, all of the peripheral edging of the upper end cap 104, around all four sides, is bent with a downward pitch angle $\alpha$ from a plane defined by a central portion of the upper end cap 104 (see FIGS. 10A and 10B). The angle $\alpha$ can be an acute angle, and in some constructions, at least 10 degrees and not more than 45 degrees. The peripheral edging can optionally be flush with the front, back, and side panels of the body 102, or may create an overhang with respect thereto. However, the upper end cap 104 does not extend down to lie directly on or against the front, back, and side panels. As shown in FIGS. 10A-12, the upper end cap 104 includes through holes for the fasteners 128, which may be rivets, or bolt-and-nut pairs, for example. However, through holes are not required in all constructions, as the upper end cap 104 can optionally have embedded (e.g., pressed-in) studs for the fasteners 128—for example, threaded stud fasteners 128 as shown in the lower end cap 106 of FIG. 13, which engage nuts to secure the upper end cap 104 to the body 102.

Figure 13:
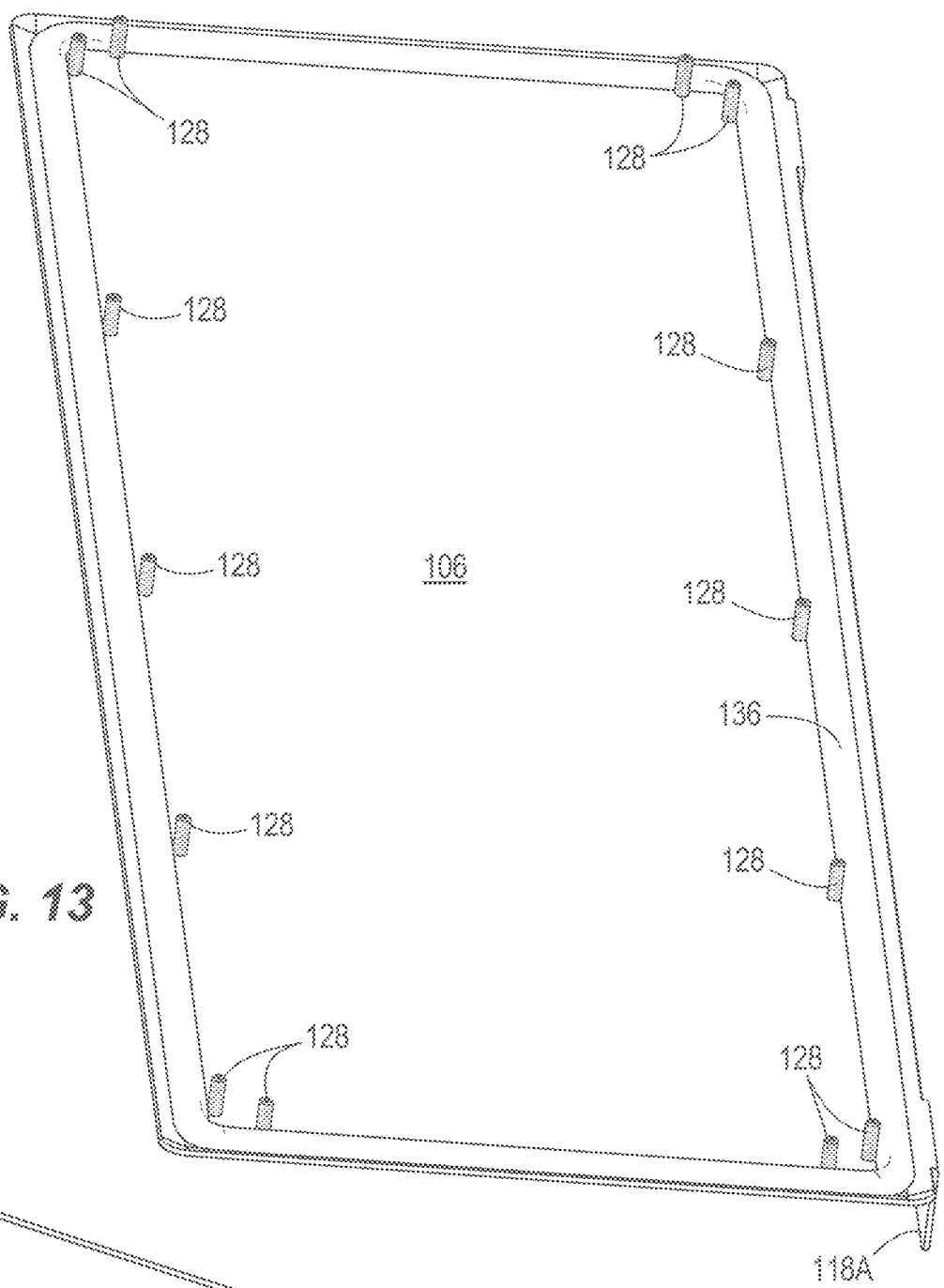
FIG. 13 is a perspective view of a bottom cap.

The lower end cap 106 as shown in FIG. 13 features the same pitched edges as the upper end cap 104, although not required in other constructions. The upper and lower end caps 104, 106 can be uniform and interchangeable in some constructions, whether having the through holes for separate fasteners or having the embedded studs. It is also noted that mounting brackets 118A are also optionally provided on the lower end cap 106. The mounting brackets 118A can have the same construction as the upper end cap mounting brackets 118 or an alternate construction, e.g., with slots or elongated holes vs. circular holes. In other constructions, the mounting brackets 118A can be formed separately from the end cap 106 and joined (e.g., by welding), to the end cap 106 and/or to the body 102. In some constructions, the mounting brackets 118, 118A of both end caps 104, 106 are used to mount the enclosure 100, while in other constructions, only one set of the mounting brackets are used.

Figure 18:
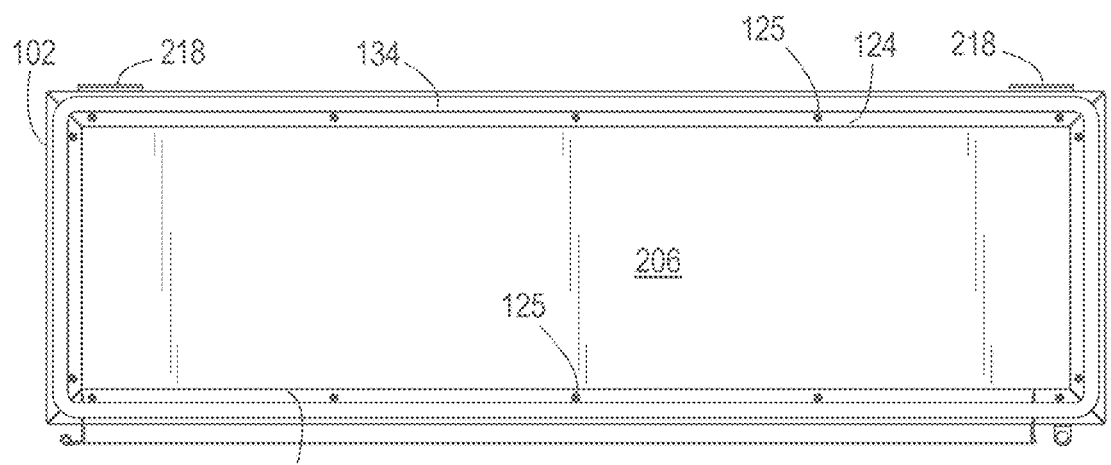
FIG. 18 is a top view of the enclosure of FIGS. 15 and 16, with the door and top cap removed.
Figure 19:
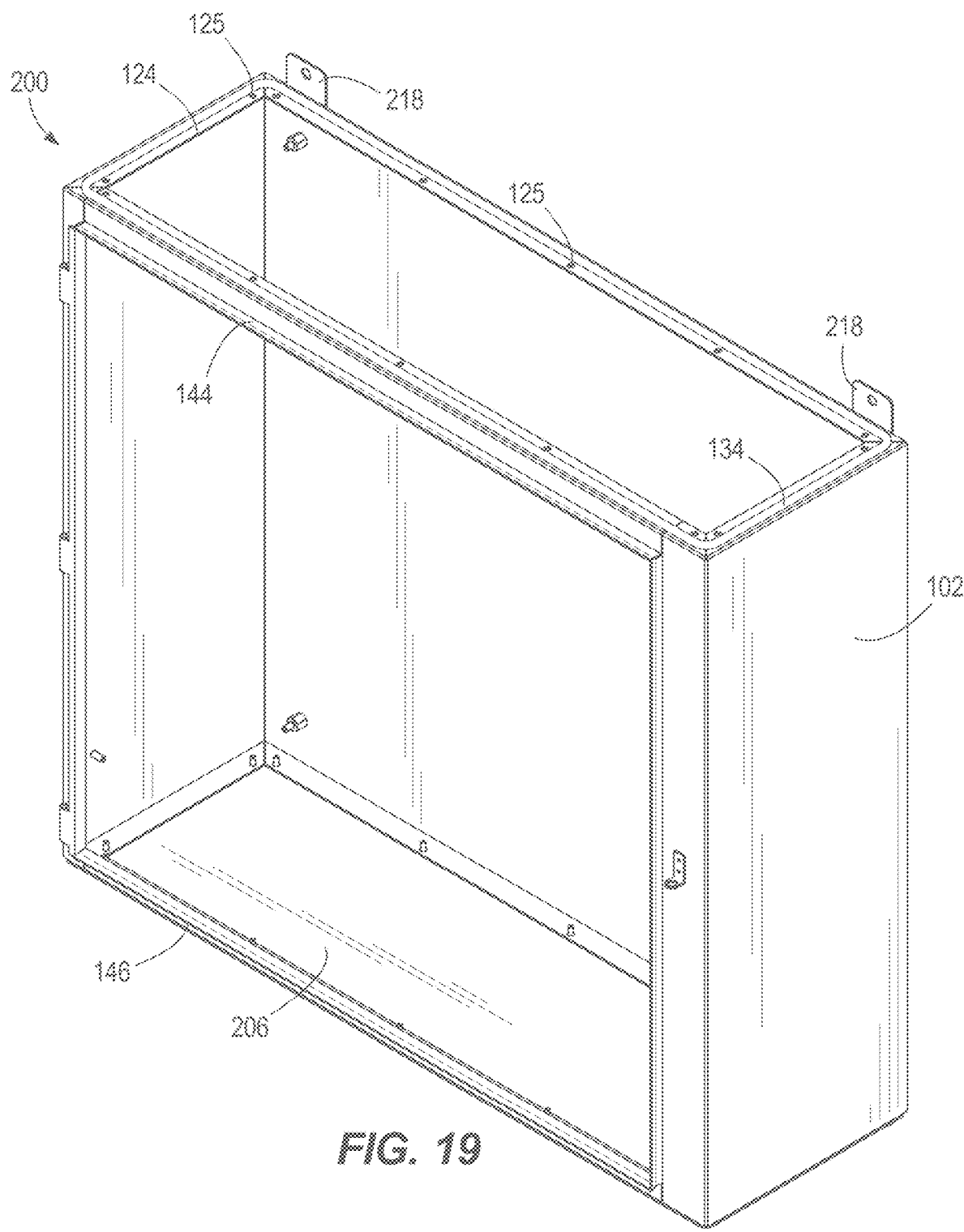
FIG. 19 is a perspective view of the enclosure of FIGS. 15 and 16, with the door and top cap removed.
Figure 20:
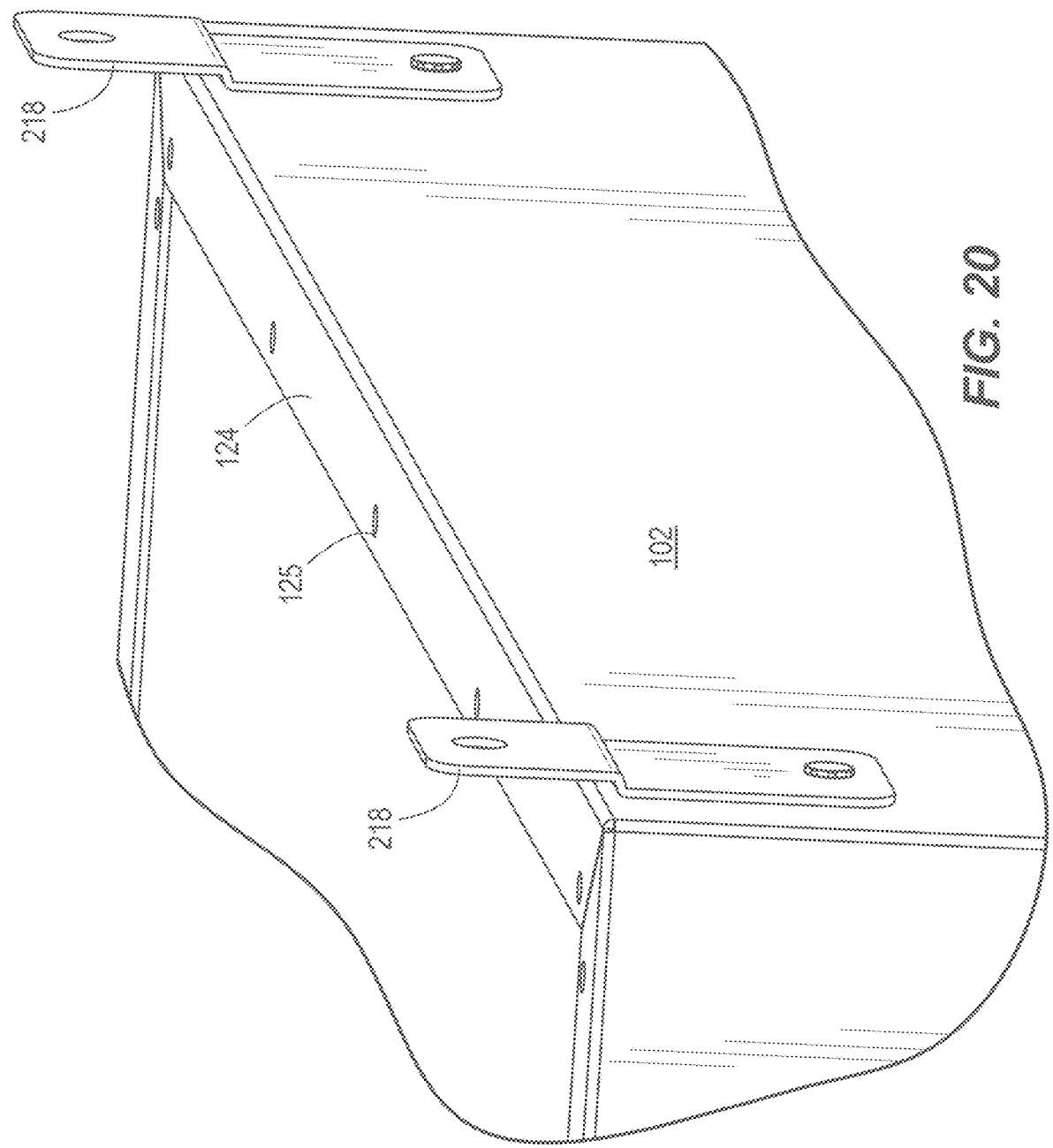
FIG. 20 is a perspective view of the upper mounting flanges on the enclosure body.
Figure 21:
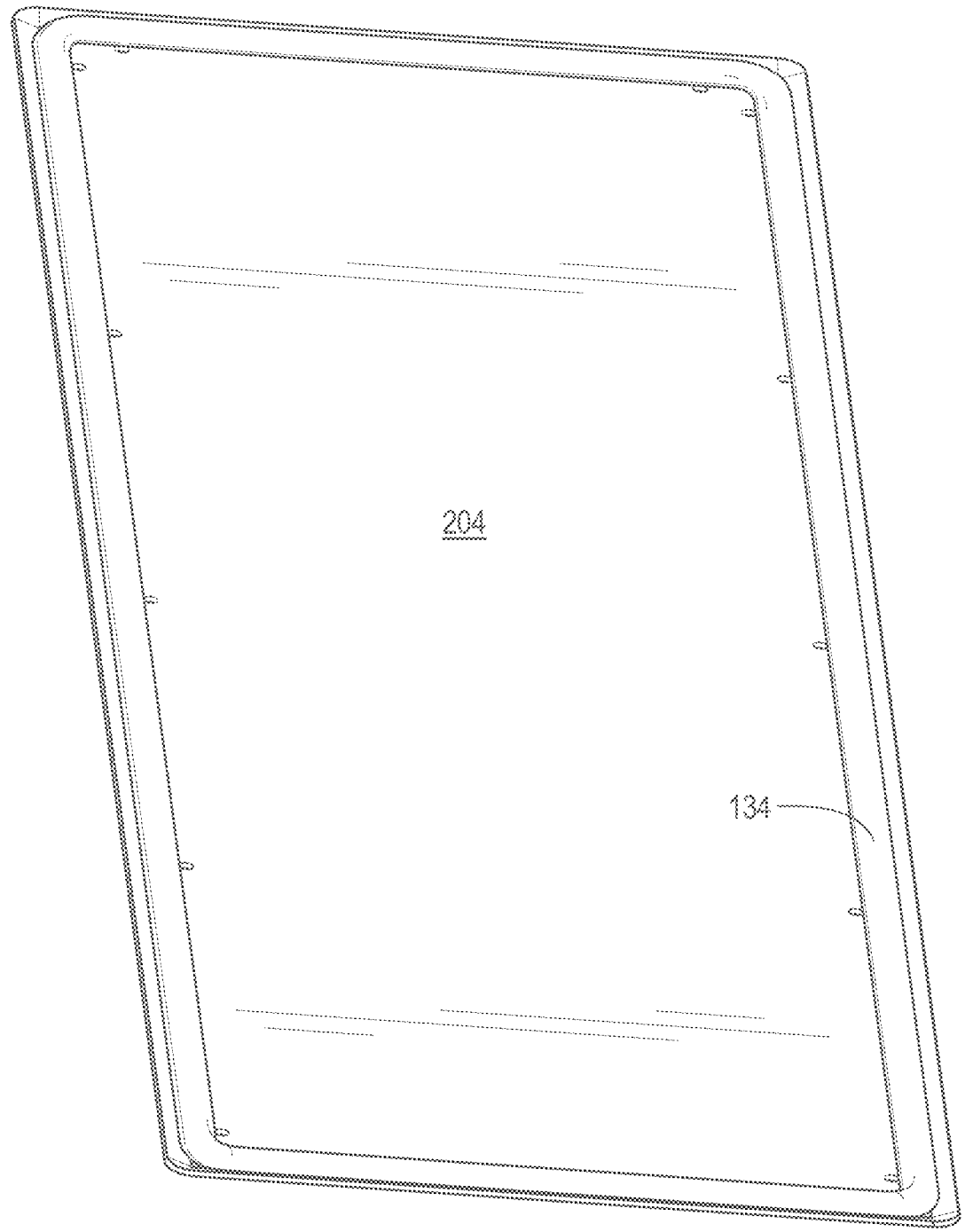
FIG. 21 is a perspective view of an upper end cap for use with an enclosure body.

With the exception of the configuration of the mounting brackets 218, 218A and the upper and lower end caps 204, 206, the enclosure 200 of FIGS. 15-21 is similar to the enclosure 100 as described above. The upper mounting brackets 218 are formed separately from the body stamping and later attached thereto, e.g., by welding and/or fastener(s) to the back body panel. Furthermore, a second set of lower mounting brackets 218A are provided to extend outwardly from the lower end of the body 102. The lower mounting brackets 218A feature elongated holes or open slots for mounting adjustability. The lower mounting brackets 218A, whether the same as or different from the upper mounting brackets 218, can be attached to the body stamping by welding and/or fastener(s), as with the upper mounting brackets 218. The upper and lower end caps 204, 206 feature no mounting flanges, but rather, each is simply a panel shaped and sized to close off the open end of the body 102. The upper end cap 204 can include fastener apertures as shown in FIG. 21, embedded fasteners, or combinations thereof, all of which are inboard of the gasket 134. The gasket 134 is shown in FIG. 21 as applied to the upper end cap 204, but the gasket 134 may alternately be applied to the upper ledge 124 as shown in FIGS. 18 and 19. The lower end cap 206 can take on any of the various features described for the upper and lower end caps 104, 106, 204, and may optionally be interchangeable with the upper end cap 204.

Figure 22:
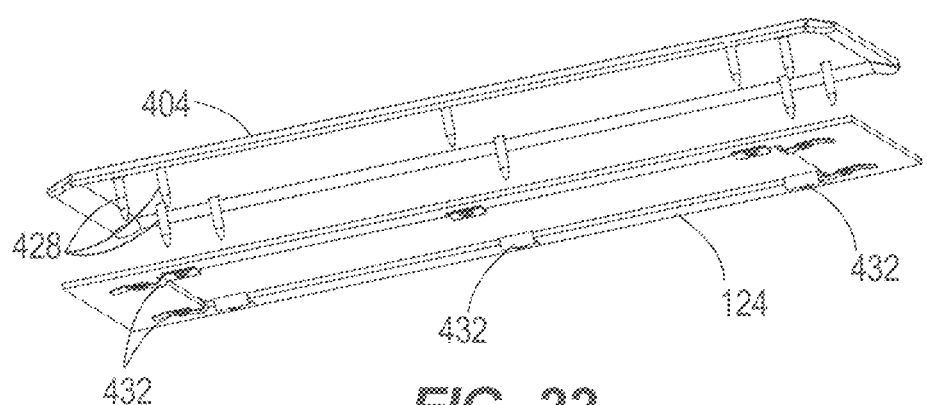
FIG. 22 is an exploded assembly view of an enclosure end cap of another embodiment, along with a ledge of the enclosure body, providing a self-clinching closure.
Figure 23:
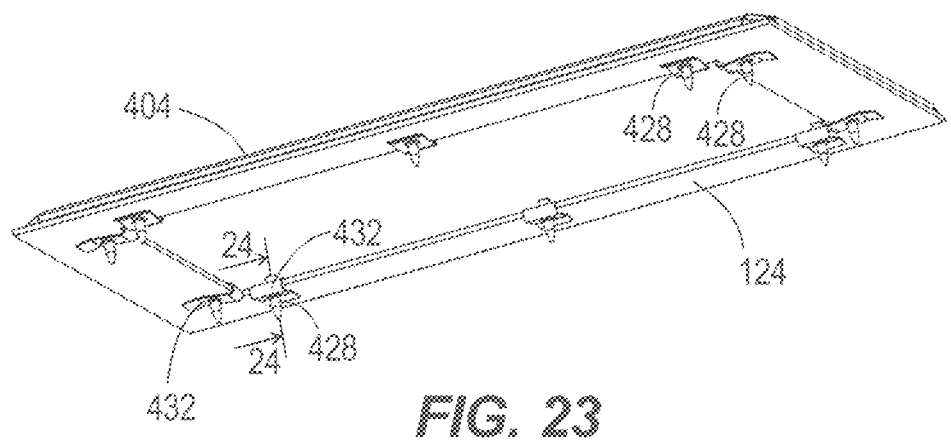
FIG. 23 is a perspective view of the enclosure cap of FIG. 22 secured with the ledge of the enclosure body via the self-clinching closure.
Figure 24:
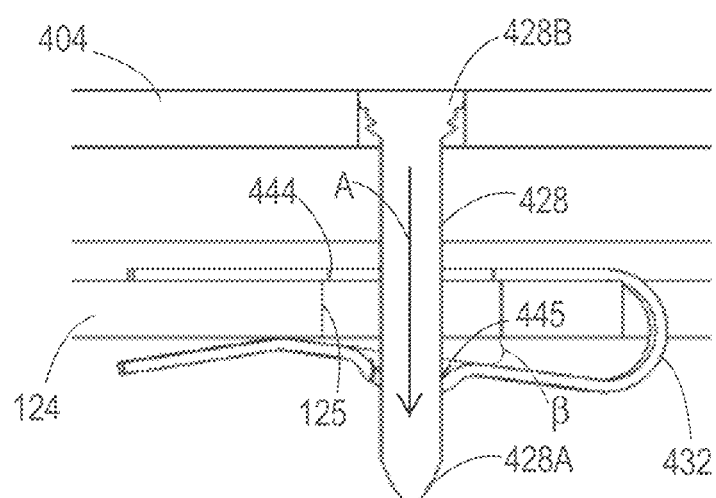
FIG. 24 is a cross-section of one fastener and clip of the self-clinching closure, taken alone line 24-24 of FIG. 23.

FIGS. 22-24 illustrate an end cap attachment or mating arrangement that can be substituted for any/all of the fasteners 128 shown and described in the preceding embodiments. In particular, FIGS. 22-24 illustrate an alternate end cap 404 construction that can be used for the upper and/or lower end caps 104, 106 of the enclosure 100 or for the upper and/or lower end caps 204, 206 of the enclosure 200 to limit or eliminate the need for threaded fasteners or rivets in the joining of the end cap 404 to the body 102 since a self-clinching closure is provided as described in further detail below. As illustrated, the end cap 404 is shown without the mounting brackets 118, although the end cap 404 can alternately be provided with the mounting brackets 118 as shown in the end cap 104 of FIGS. 10A and 10B. Likewise, the end cap 404 can be provided with or without a peripheral gasket like the gasket 120 described above, akin to the gaskets 134, 136. For example, a similar gasket can be provided on the body 102 (e.g., on the ledge 124, 126) for compression and sealing when the end cap 404 is installed, in the circumstance that no gasket is formed on the end cap 404.

As best shown in FIGS. 22 and 24, the end cap 404 includes a plurality of fasteners 428 in the form of pilot pins. Each of the fasteners 428 has a tapered (e.g., conical) tip 428A or distal end opposite a head end 428B. The fasteners 428 can be embedded or integrated with the end cap 404, for example being press-fit, bonded, and/or welded into position. Similar to the fasteners 128, the fasteners 428 are distributed around a periphery of the end cap 404 and positioned to be spaced inward (peripherally) of a downwardly pitched peripheral edging of the end cap 404. The fasteners 428 may be spaced inwardly just enough to accommodate a sealing gasket like the gaskets 120, 134, 136 described above. Although the fasteners 428 may take various forms, each fasteners 428 can be a metal pin (e.g., mild steel) having a smooth shank between the pointed tip 428A and the head 428B in some constructions. In other constructions, the material and/or shank configuration may differ. For example, the fasteners 428 can have a ribbed or corrugated shank in some constructions. The fasteners 428 may also be manufactured of a strong thermoplastic or a high-performance plastic such as high-strength thermoplastic or composite thermoplastic in some constructions, example non-metallic materials including for example nylon), poly(phenylene sulfide) (PPS), and polyetheretherketone (PEEK).

In FIGS. 22-24 it should be understood that, for illustrative purposes only, the upper ledge 124 of the body 102 is shown without the rest of the body 102. Although the ledge 124 includes a plurality of apertures 125 corresponding to the plurality of fasteners 428, the ledge 124 also receives a plurality of corresponding clips 432. Each of the clips 432 cooperates with one of the fasteners 428 to engage and clinch the shank of the fastener 428 when the fastener 428 penetrates through the ledge aperture 125 and through the clip 432. As illustrated, each clip 432 can have a modified U-shape that wraps around the inner periphery of the ledge 124. Each clip 432 can thus define a mouth that slides onto the ledge 124. The mouth may be sized so that elastic deflection of the clip 432 is required to press the clip 432 onto the ledge 124, and as such, the clips 432 may provide a tight fit that maintains the desired alignment with the ledge apertures 125 during assembly. As shown in FIG. 24, each clip 432 has an outer leg with an outer aperture 444 and an inner leg with an inner aperture 445, referring to the inner and outer sides of the ledge 124 and body 102. The outer aperture 444 may be larger than the inner aperture 445, and the outer aperture 444 may be sized to provide clearance and no engagement with the fastener 428. On the other hand, the inner aperture 445 is sized to engage and clinch the fastener 428. The inner aperture 445 can be sized to provide an interference fit, although the interference fit may be attributable at least partially to an angled orientation of the inner leg of the clip 432 with respect to the ledge 124 (i.e., the inner leg portion having the inner aperture 445 forming an angle β of 5 to 15 degrees from the surface of the ledge 124). It can also be seen in FIG. 24 that the inner aperture 445 can be formed at the edge of a ramped lead-in surface where the material of the clip protrudes locally inwardly. The inner apertures 445 can be circular or variously configured to achieve the desired clinching effect. The clips 432 may be constructed of sheet metal (e.g., mild steel) of a suitable thickness or gauge. Although not shown in FIG. 24, the gasket is positioned to the left of the fastener 428 (toward the outer peripheral edge).

At least a portion of the edge forming the inner aperture 445 engages the shank of the fastener 428 when the fastener 428 is installed in the installation direction A. The edge of the inner aperture 445 may form a sharp edge that at least partially cuts into the surface of the shank of the fastener 428. The engagement between the fasteners 428 and the corresponding inner clip apertures 445 may be the sole engagement means for retaining the end cap 404 to the body 102. As mentioned above, this end cap arrangement may be present at either or both ends of the body 102. In assembly, the only step for attachment of the end cap 404 to the body 102, following proper alignment of all the fasteners 428 with the apertures 125 and the clips 432, can be pressing of the end cap 404 along the installation direction A. Said another way, the end cap 404 is translated parallel to the length L of the enclosure. Further, this assembly step may be accomplished manually by hand, without the use of any tools. The gasket between the ledge 124 and the end cap 404 is compressed during installation of the end cap 404, and maintained compressed upon release of the end cap 404 without further assembly action or hardware. Thus, the end cap 404 can close and seal the opening at either end of the body 102 unilaterally by pressing the end cap 404 into position solely with a one-direction motion, without any further steps. Engagement of the clip inner apertures 445 with the respective fasteners 428 prevents or inhibits the movement of the end cap 404 in a direction opposite the installation direction A. Although it may be possible with proper tools and force to pry off the end cap 404 once installed, the end cap closure is not designed for removal and such removal may result in damage. For example, the clips 432 may need to be discarded and replaced if the end cap 404 is removed following a prior installation. Thus, the end cap closure can be a permanent, one-time-use fastening structure. The engagement of the fasteners 428 with the clips 432 cannot readily be loosened or "backed-out", and therefore decompression of the interstitial gasket does not occur after initial compression. It may also be beneficial that the entire gasket can be compressed at one time during pressing on of the end cap 404, which would otherwise be highly complicated or impossible with threaded fasteners or rivets. When used on both ends of the body 102, both end openings of the enclosure may be closed and sealed without manipulation of any fasteners or hardware, as the only action required for installation is the pressing of the entire end cap 404 in the installation direction A (and it is noted that the installation directions for two opposed end caps will be opposite and toward one another). In other constructions, the end cap 404 may only be used on one end, while a different end cap (or an integral body panel) is provided on the opposite end. In further constructions, it is also conceived for the fasteners 428 to engage directly with the ledge apertures 125 to form self-clinching joints similar to those provided by the clips 432 in the illustrated embodiment.

What is claimed is:

1. A protective enclosure for electrical components, the enclosure comprising:

a body defining a front opening and an end opening, wherein the body includes a front panel, a rear panel, and two side panels;
a door coupled to the body to selectively close the front opening;
an end cap provided to close the end opening;
a ledge formed in the body to surround the end opening, the ledge lying perpendicular to the front, rear, and side panels, wherein a plurality of apertures are provided along the ledge; and
a gasket providing a seal between the end cap and the ledge,
wherein a plurality of fasteners embedded into the end cap engage with a plurality of corresponding clips assembled onto the ledge at the locations of the plurality of apertures so as to form a permanent, one-time-use closure that compresses the gasket and maintains compression thereof in response to nothing more than movement of the end cap toward the ledge in a single installation direction perpendicular to the ledge.

2. The enclosure of claim 1, wherein the gasket is arranged peripherally outside of the plurality of apertures along the ledge.

3. The enclosure of claim 1, wherein the gasket is affixed to one of the ledge and the end cap.

4. The enclosure of claim 1, wherein the plurality of fasteners include pilot pins having tapered tips and shanks, and wherein each of the plurality of clips is provided with an outer leg lying against an outer surface of the ledge and having an outer aperture therein, and an inner leg lying against an inner surface of the ledge and having an inner aperture therein, wherein retention of the end cap to the ledge is provided by engagement of the pilot pin shanks with the respective inner clip apertures.

5. The enclosure of claim 4, wherein the shanks of the pilot pins are smooth.

6. The enclosure of claim 1, further comprising:
a second end cap provided to close a second end opening defined in the body;
a second ledge formed in the body to surround the second end opening, the second ledge lying perpendicular to the front, rear, and side panels, wherein a plurality of apertures are provided along the second ledge; and
a second gasket providing a seal between the second end cap and the second ledge,
wherein a plurality of fasteners embedded into the second end cap engage with a plurality of corresponding clips assembled onto the second ledge at the locations of the plurality of apertures so as to form a permanent, one-time-use closure that compresses the second gasket and maintains compression thereof in response to nothing more than movement of the second end cap toward the second ledge in a single installation direction perpendicular to the second ledge.

7. The enclosure of claim 6, wherein each of the first and second gaskets is an addition-curing two-component system, applied with formed-in-place foam gasket technology.

8. The enclosure of claim 1, further comprising at least one mounting bracket, the at least one mounting bracket extending from the body or the end cap.

9. The enclosure of claim 1, wherein the end cap provides a water-tight seal with the body.

10. The enclosure of claim 1, wherein the front panel, rear panel, and two side panels of the body are formed at least in part by a single continuous material sheet.

11. A protective enclosure for electrical components, the enclosure comprising:
a body defining a front opening, a first end opening with a first ledge, and a second end opening with a second ledge, wherein the body includes a front panel, a rear panel, and two side panels, all of which are formed at least in part by a single continuous material sheet;
a door coupled to the body to selectively close the front opening;
a first end cap provided to close the first end opening;
a first plurality of apertures provided in the first ledge;
a first gasket disposed between the first end cap and the first ledge, wherein a plurality of fasteners embedded into the first end cap engage with a plurality of corresponding clips assembled onto the first ledge at the locations of the first plurality of apertures so as to form a permanent, one-time-use closure that compresses the first gasket and maintains compression thereof in response to nothing more than movement of the first end cap toward the first ledge in a single installation direction perpendicular to the first ledge;
a second end cap provided to close the second end opening;
a second plurality of apertures provided in the second ledge; and
a second gasket disposed between the second end cap and the second ledge, wherein a plurality of fasteners embedded into the second end cap engage with a plurality of corresponding clips assembled onto the second ledge at the locations of the second plurality of apertures so as to form a permanent, one-time-use closure that compresses the second gasket and maintains compression thereof in response to nothing more than movement of the second end cap toward the second ledge in a single installation direction perpendicular to the second ledge,
wherein the first and second end openings are closed and sealed water-tight by the respective permanent, one-time-use closures of the first and second end caps.

12. The enclosure of claim 11, wherein the first gasket is arranged peripherally outside of the first plurality of apertures along the first ledge, and the second gasket is arranged peripherally outside of the second plurality of apertures along the second ledge.

13. The enclosure of claim 11, wherein the pluralities of fasteners embedded into the first and second end caps include pilot pins having tapered tips and shanks, and wherein each of the plurality of clips on the first and second ledges is provided with an outer leg lying against an outer surface of the respective first or second ledge and having an outer aperture therein, and an inner leg lying against an inner surface of the respective first or second ledge and having an inner aperture therein, wherein retention of the first and second end caps to the first and second ledges is provided by engagement of the pilot pin shanks with the respective inner clip apertures.

14. The enclosure of claim 13, wherein the shanks of the pilot pins are smooth.

15. The enclosure of claim 11, wherein the first gasket is affixed to one of the first ledge and the first end cap, and wherein the second gasket is affixed to one of the second ledge and the second end cap.

16. The enclosure of claim 11, wherein each of the first and second gaskets is an addition-curing two-component system, applied with formed-in-place foam gasket technology.

17. The enclosure of claim 11, further comprising at least one mounting bracket, the at least one mounting bracket extending from the body, the first end cap, or the second end cap.

18. A method of assembling a protective enclosure for electrical components, the method comprising:
    forming a body defining a front opening and an end opening, wherein the body includes a front panel, a rear panel, and two side panels;
    forming a ledge around the end opening, the ledge lying perpendicular to the front, rear, and side panels, the ledge having a plurality of apertures therein;
    attaching a plurality of clips to the ledge at the locations of the plurality of apertures;
    coupling a door to the body to selectively close the front opening;
    providing an end cap with a plurality of embedded fasteners protruding therefrom in an installation direction;
    affixing a gasket to one of the end cap and the ledge; and
    pressing the end cap in the installation direction to move the plurality of fasteners toward and through the plurality of apertures in the ledge to form a permanent, water-tight, one-time-use closure that compresses the gasket and maintains compression thereof in response to nothing more than the pressing of the end cap in the installation direction.

19. The method of claim 18, further comprising:
    forming a second ledge around a second end opening formed in the body, the second ledge lying perpendicular to the front, rear, and side panels, the second ledge having a plurality of apertures therein;
    attaching a second plurality of clips to the second ledge at the locations of the plurality of apertures;
    providing a second end cap with a plurality of embedded fasteners protruding therefrom in a second installation direction;
    affixing a second gasket to one of the second end cap and the second ledge; and
    pressing the second end cap in the second installation direction to move the plurality of fasteners toward and through the plurality of apertures in the second ledge to form a permanent, water-tight, one-time-use closure that compresses the second gasket and maintains compression thereof in response to nothing more than the pressing of the second end cap in the second installation direction.

* * * * *